(12) United States Patent
Kojima et al.

(10) Patent No.: US 8,502,549 B2
(45) Date of Patent: Aug. 6, 2013

(54) TEST APPARATUS AND DRIVER CIRCUIT

(75) Inventors: Shoji Kojima, Gunma (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 281 days.

(21) Appl. No.: 12/957,184

(22) Filed: Nov. 30, 2010

(65) Prior Publication Data

US 2011/0163771 A1    Jul. 7, 2011

Related U.S. Application Data

(63) Continuation of application No. PCT/JP2009/002059, filed on May 12, 2009.

(30) Foreign Application Priority Data

Jun. 26, 2008  (JP) .................................. 2008-167826

(51) Int. Cl.
  *G01R 31/00* (2006.01)
  *G01R 31/319* (2006.01)

(52) U.S. Cl.
  CPC ................................ *G01R 31/31924* (2013.01)
  USPC .................................................... 324/750.01

(58) Field of Classification Search
  None
  See application file for complete search history.

(56) References Cited

U.S. PATENT DOCUMENTS

| | | | |
|---|---|---|---|
| 3,454,882 A * | 7/1969 | Miller | ......................... 455/252.1 |
| 5,066,873 A | 11/1991 | Chan et al. | |
| 5,153,457 A | 10/1992 | Martin et al. | |
| 5,650,336 A * | 7/1997 | Eriguchi et al. | .............. 324/719 |
| 6,255,839 B1 | 7/2001 | Hashimoto | |
| 7,236,905 B2 * | 6/2007 | Kodera | ......................... 702/124 |
| 2006/0116843 A1 | 6/2006 | Kodera | |
| 2007/0262778 A1 | 11/2007 | Ando et al. | |

FOREIGN PATENT DOCUMENTS

| | | |
|---|---|---|
| CN | 101057198 A | 10/2007 |
| JP | 3-190320 A | 8/1991 |
| JP | 4-302526 A | 10/1992 |
| JP | 11-133068 A | 5/1999 |
| JP | 2002-139551 A | 5/2002 |
| JP | 2006-155419 A | 6/2006 |
| JP | 2007-303986 A | 11/2007 |

OTHER PUBLICATIONS

International Search Report (ISR) issued in PCT/JP2009/002059 (parent application) mailed in Jun. 2009 for Examiner consideration, citing U.S. Patent Nos. 2-3 and U.S. Patent Application Publication Nos. 1-2, and Foreign Patent document Nos. 2-6 listed above.

(Continued)

*Primary Examiner* — Paresh Patel

(57) ABSTRACT

A test apparatus includes: a driver circuit that supplies, to a device under test, a test signal corresponding to an input signal; and a judging section that judges pass/fail of the device under test, based on the load voltage or the load current supplied to the device under test when supplying a test signal of a constant current or a constant voltage to the device under test from the driver circuit, where the driver circuit includes: a driver section that outputs the test signal; a supply current detecting section that detects a supply current supplied to the driver section; and an output control section that controls a voltage or a current of the test signal outputted from the driver section to the predetermined value, based on the supply current detected by the supply current detecting section.

30 Claims, 16 Drawing Sheets

OTHER PUBLICATIONS

Written Opinion (PCT/ISA/237) issued in PCT/JP2009/002059 (parent application) mailed in Jun. 2009.

JP Office Action/ Search Report and Computer Translation Dated Dec. 4, 2012; Application No. 2010-517675.

TW Office Action/Search Report and English Translation Dated Nov. 7, 2012; Application No. 098119441.

* cited by examiner

TEST APPARATUS AND DRIVER CIRCUIT

BACKGROUND

1. Technical Field

The present invention relates to a test apparatus and a driver circuit.

2. Related Art

One known type of test apparatuses of a device under test such as a semiconductor circuit is an apparatus for conducting a functional test and a direct current test of a device under test (for example, see Japanese Patent Application Publication No. 2002-139551). In a functional test, judgment as to whether a device under test is functional normally is performed based on a response signal outputted from the device under test in response to a pattern signal having a predetermined logic pattern. In a direct current test, whether the power consumed by the device under test falls within a predetermined range or not is judged.

A test apparatus performing a functional test or a direct current test of a device under test includes a functional test circuit and a direct current test circuit for each pin connected to the device under test, and switches which one of the functional test circuit and the direct current test circuit is to be connected to the device under test, depending a test to be performed.

For example, Japanese Patent Application Publication No. 2002-139551 provides a relay on a transmission path between a circuit of a test apparatus and a device under test, to switch which of the driver to output a pattern signal and a direct current test device is to be connected to the device under test. U.S. Pat. No. 6,255,839 also discloses a related technology.

Recent years have seen substantial increase in semiconductor circuits adapted to high frequencies. It has become accordingly desirable to produce a test apparatus for testing a semiconductor circuit which can supply a high frequency pattern signal to a device under test. However, if a relay is provided on a transmission path between a circuit of a test apparatus and a device under test to realize both of the functional test and the direct current test as mentioned above, transmission of the high frequency pattern signal would become comparatively difficult.

Provision of both of the functional test circuit and the direct current test circuit for each pin of a test apparatus would also be problematic because it would incur substantial cost increase of the test apparatus as well as from the point of view of efficient use of circuits because the pins have to switch between a functional test circuit and a direct current test circuit. In addition to the above, provision of a relay for switching between the functional test circuit and the direct current test circuit becomes necessary, which adds further costs.

SUMMARY

Therefore, it is an object of an aspect of the innovations herein to provide a test apparatus and a driver circuit, which are capable of overcoming the above drawbacks accompanying the related art. The above and other objects can be achieved by combinations described in the claims. Therefore, it is an object of an aspect of the innovations herein to provide a test apparatus for judging pass/fail of a device under test depending on a load voltage or a load current supplied to the device under test, the test apparatus including: a driver circuit that supplies, to the device under test, a test signal corresponding to an input signal; and a judging section that judges pass/fail of the device under test, based on the load voltage supplied to the device under test when the test signal having a current of a predetermined value is supplied to the device under test from the driver circuit, or based on the load current supplied to the device under test when the test signal having a voltage of a predetermined value is supplied to the device under test from the driver circuit, where the driver circuit includes: a driver section that outputs the test signal; a supply current detecting section that detects a supply current supplied to the driver section; and an output control section that controls a voltage or a current of the test signal outputted from the driver section to the predetermined value, based on the supply current detected by the supply current detecting section.

A second aspect of the innovations may include a driver circuit for outputting a signal corresponding to an input signal, including: a driver section that outputs the signal corresponding to the input signal; a supply current detecting section that detects a supply current supplied to the driver section; and an output control section that controls a voltage or a current of a signal outputted from the driver section to a predetermined value, based on the supply current detected by the supply current detecting section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
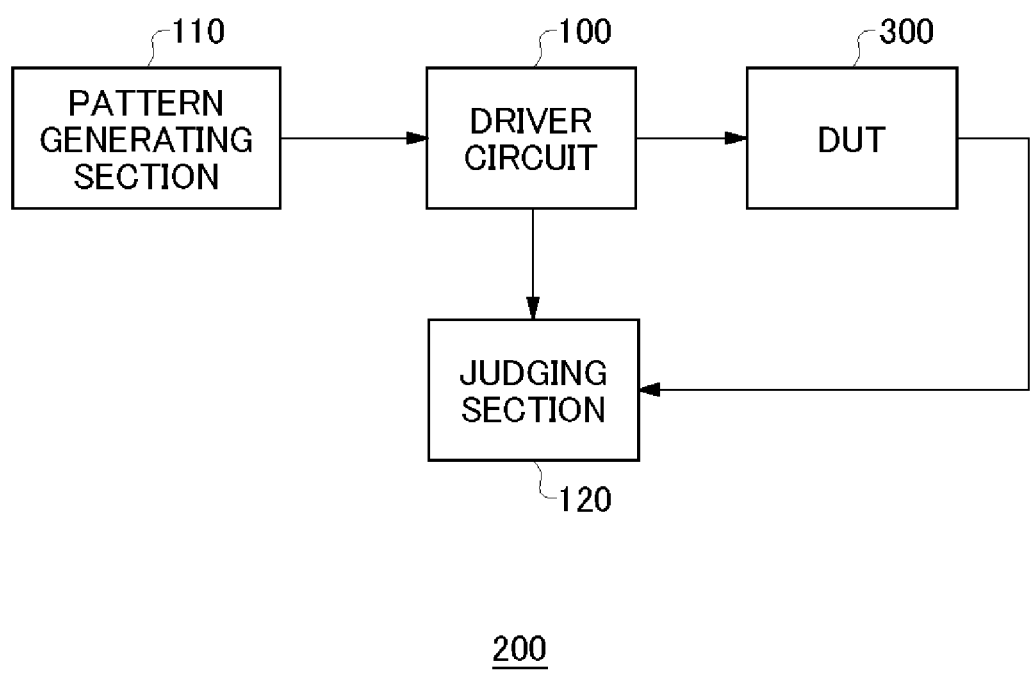
FIG. 1 is a block diagram showing an exemplary functional configuration of a test apparatus 200 according to an embodiment, together with a device under test 300.

FIG. 1 is a block diagram showing an exemplary functional configuration of a test apparatus 200 according to an embodiment, together with a device under test 300. The test apparatus 200 tests a device under test 300 such as a semiconductor circuit, and includes a pattern generating section 110, a driver circuit 100, and a judging section 120. Note that the test apparatus 200 includes an operation mode for a functional test and an operation mode for a direct current test for the device under test 300.

The functional test may test pass/fail of a device under test 300, in response to a response signal outputted from the device under test 300 that has received a pattern signal having a predetermined logic pattern. The direct current test may test pass/fail of a device under test 300 based on the current or the voltage supplied to the device under test 300 when a constant voltage signal or a constant current signal is supplied to the device under test 300.

The pattern generating section 110 generates pattern data having a predetermined logic pattern, and supplies the generated pattern data to the driver circuit 100. For example, the pattern generating section 110 may generate the pattern data based on data or an algorithm provided in advance by a user or the like. In the functional test, the pattern generating section 110 may generate pattern data having a logic pattern to cause the internal circuit of the device under test 300 to perform a predetermined operation. In the direct current test, the pattern generating section 110 may generate pattern data whose logic value is fixed to either H logic or L logic.

The driver circuit 100 supplies, to the device under test 300, a signal corresponding to the input signal provided by the pattern generating section 110. Here, the signal includes a supply voltage or a supply current for driving the device under test 300. In the functional test, the driver circuit 100 generates a pattern signal having a logic pattern generated by the pattern generating section 110, and supplies the generated pattern signal to the device under test 300. In the direct current test, the driver circuit 100 may generate a constant current signal of a constant electric-current value or a constant voltage signal of a constant voltage based on the pattern data whose logic value is fixed, and supply the generated constant current signal or the constant voltage signal to the device under test 300.

The judging section 120 judges pass/fail of the device under test 300. In the functional test, the judging section 120 judges pass/fail of the device under test 300, based on the response signal outputted from the device under test 300 based on the pattern signal. For example, the judging section 120 may judge pass/fail of the device under test 300, by comparing the logic pattern of the response signal to a predetermined expected value pattern.

In the direct current test, the judging section 120 may judge pass/fail of the device under test 300, based on the load voltage or the load current supplied to the device under test 300 by the driver circuit 100 when the driver circuit 100 has supplied a constant current signal or a constant voltage signal to the device under test 300. For example, the judging section 120 may judge pass/fail of the device under test 300 based on whether the load voltage or the load current falls within a predetermined range. The stated configuration enables to perform the functional test or the direct current test of the device under test 300.

Figure 2:
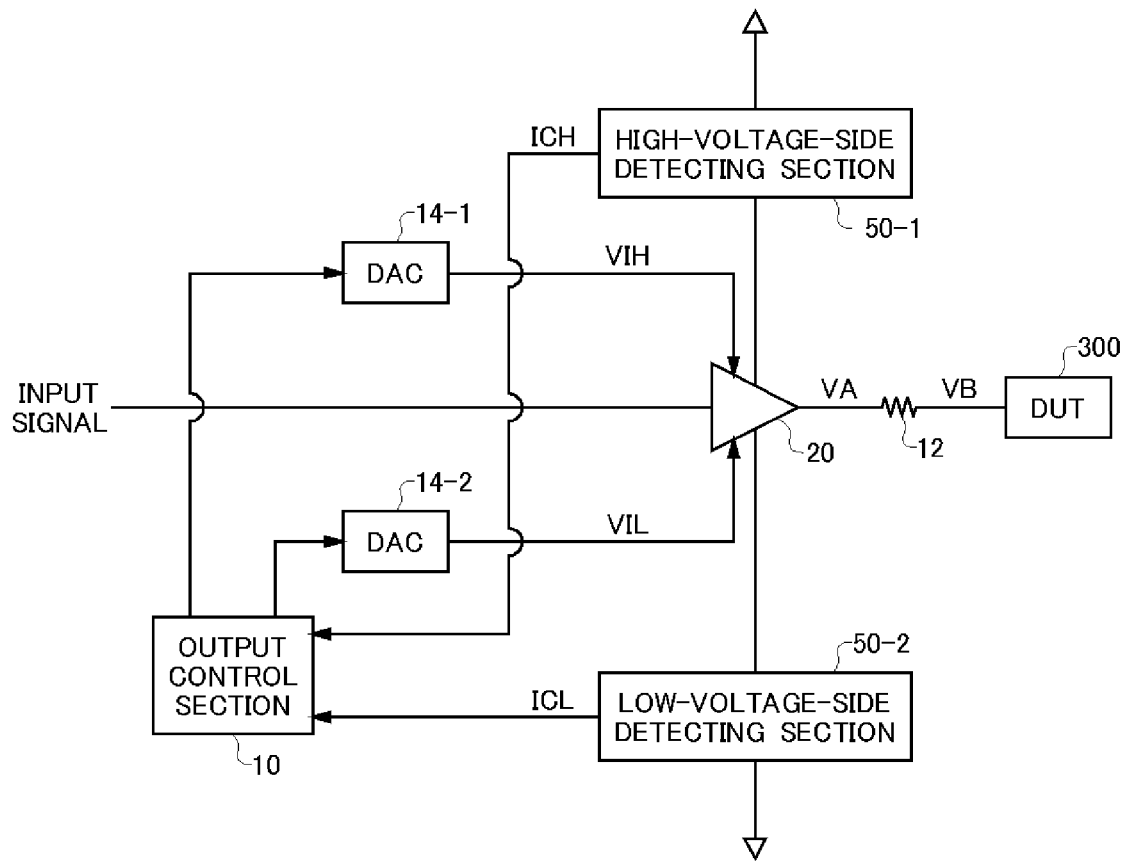
FIG. 2 shows an exemplary configuration of a driver circuit 100.

FIG. 2 shows an exemplary configuration of a driver circuit 100. The driver circuit 100 supplies a signal to the device under test 300 such as a semiconductor circuit connected as a load. The driver circuit 100 includes an output control section 10, a transmission end resistance 12, a setting section 14, a driver section 20, and a supply current detecting section 50.

The pattern generating section 110 provides the driver section 20 with pattern data as an input signal. The driver section 20 generates a signal corresponding to the pattern data, and outputs the generated signal to the device under test 300 via the transmission end resistance 12. The transmission end resistance 12 may be a resistance provided on the output end of the driver 20, or may be a resistance provided inside the driver section 20. The resistance value of the transmission end resistance 12 may be desirably a known value.

The output control section 10 switches which of the pattern signal having a predetermined logic pattern, the constant current signal controlled to a constant current, or the constant voltage signal controlled to a constant voltage is outputted from the driver 20. The output control section 10 may control the driver section 20 to bring the output end of the driver section 20 into a high-impedance state. The output control section 10 in the present example may cause the driver section 20 to output a pattern signal when performing a functional test, and cause the driver section 20 to output a constant current signal or a constant voltage signal when performing a direct current test.

The driver section 20 outputs a voltage corresponding to a supplied voltage. The driver section 20 in the present example is provided with a high voltage VIH and a low voltage VIL. The driver section 20 may output a voltage corresponding to a supplied voltage corresponding to the logic value of the supplied pattern data. For example, when the logic value of the pattern data is H logic, the driver section 20 may output the voltage corresponding to the supplied voltage VIH. When the logic value of the pattern data is L logic, the driver section 20 may output the voltage corresponding to the supplied voltage VIL. Accordingly, the driver section 20 outputs a signal corresponding to the pattern data.

The driver section 20 is provided between a high voltage power-source line and a low voltage power-source line, and receives a supply current from these power-source lines. The driver section 20 may exchange, between the high voltage power-source line and the low voltage power-source line, the supply current corresponding to the load current to be provided to the device under test 300. For example, the driver section 20 may supply the current from the high voltage power-source line to the device under test 300. The driver section 20 may also draw in the current from the device under test 300 to the low voltage power-source line.

The supply current detecting section 50 detects the supply current supplied to the driver section 20. The supply current detecting section 50 in the present example includes a high-voltage-side detecting section 50-1 and a low-voltage-side detecting section 50-2. The high-voltage-side detecting section 50-1 detects an electric-current value of the high voltage current ICH supplied from the high voltage power-source line to the driver section 20. The low-voltage-side detecting section 50-2 detects an electric-current value of the low voltage current ICL drawn in from the driver section 20 to the low voltage power-source line.

The output control section 10 controls the voltage or the current of a test signal outputted from the driver section 20, based on the supply current detected by the supply current detecting section 50. The output control section 10 may control the voltage or the current of a test signal outputted from the driver section 20, to a constant value set by a user or the like.

The output control section 10 may control the voltage or the current of a test signal, by controlling at least one of the plurality of supplied voltages to the driver section 20. The output control section 10 in the present example outputs digital setting data representing the voltage level of a supplied voltage.

The setting section 14 generates the supplied voltage VIH and the supplied voltage VIL based on the setting data supplied from the output control section 10. The setting section 14 may be DA converters provided for the supplied voltages VIH and VIL respectively.

In the functional test of the device under test 300, the output control section 10 may supply setting data unique to each setting section 14. The output control section 10 may also control the pattern generating section 110 to output pattern data having a predetermined logic pattern. Accordingly, the driver section 20 outputs a pattern signal in which the voltage level corresponding to the H logic and the L logic in the logic pattern of a test signal is fixed.

In the direct current test of the device under test 300, the output control section 10 may control the pattern generating section 110 to output a signal whose logic value is fixed. The output control section 10 controls, from among the supplied voltages to the driver section 20, the supplied voltage corresponding to the logic value outputted from the pattern generating section 110, based on the supply current to the driver section 20. Such a control can be dynamically performed while a signal is supplied to the device under test 300, so as to supply a constant voltage signal or a constant current signal to the device under test 300.

In this way, by having a common driver section 20 used in both of a functional test and a direct current test, the driver circuit 100 in the present example can have a reduced circuit size. Provision of a common driver section 20 used in both of a functional test and a direct current test also eliminates the need of providing a relay for switching the functional test circuit and the direct current test circuit, on the transmission path between the device under test 300 and the driver section 20. Consequently, a device under test 300 can be provided with a higher frequency pattern signal than a pattern signal provided to test apparatuses that have to switch between the functional test circuit and the direct current test circuit.

Figure 3:
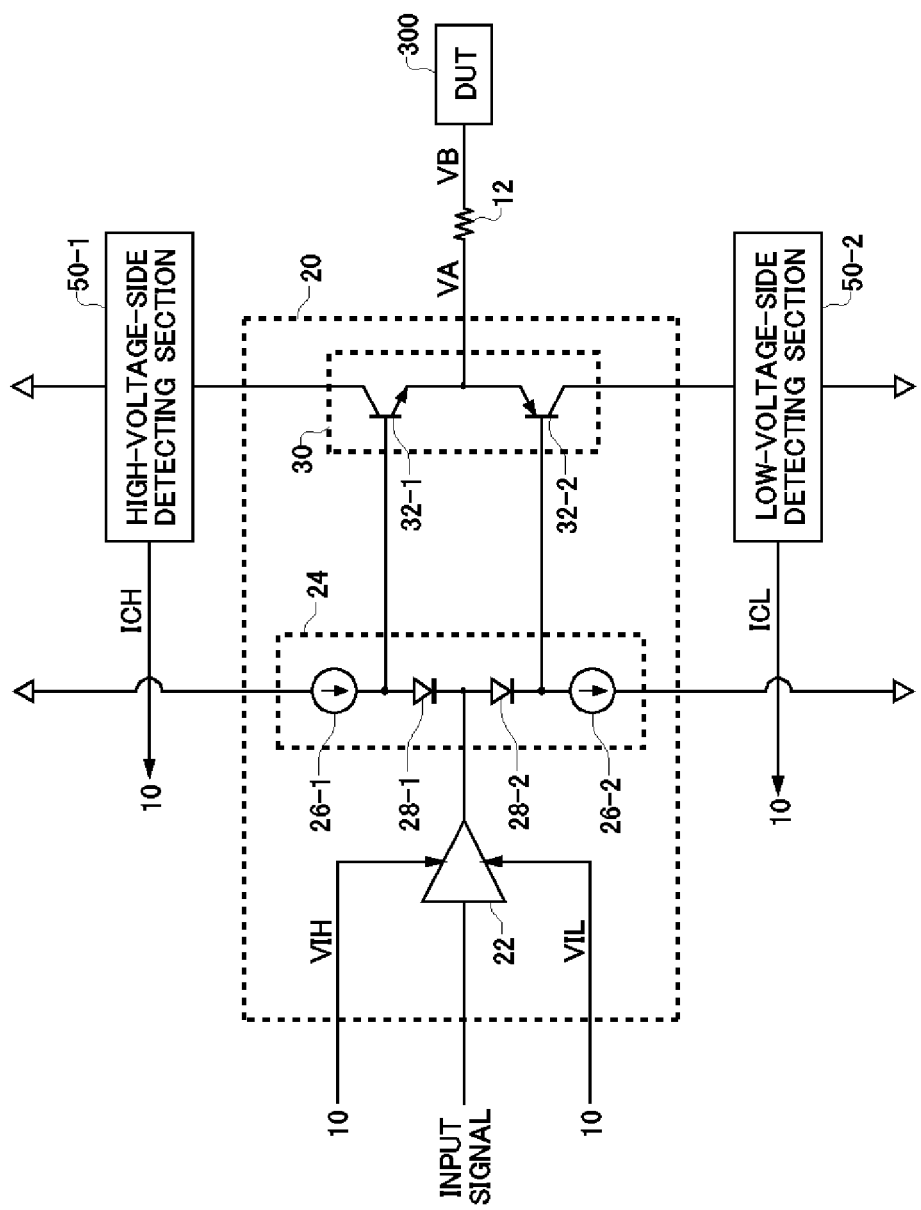
FIG. 3 shows an exemplary circuit configuration of a driver section 20.

FIG. 3 shows an exemplary circuit configuration of the driver section 20. The driver section 20 in the present example includes a pre-driver 22, a voltage shift section 24, and a buffer 30. The pre-driver 22 receives a plurality of supplied voltages (VIH, VIL) whose voltage value is controlled by the output control section 10. In addition, the pre-driver 22 supplies the voltage corresponding to the supplied voltage corresponding to the logic value of the input signal supplied from the pattern generating section 110, to the buffer 30 via the voltage shift section 24. For example, the pre-driver 22 may output the voltage substantially equal to the supplied voltage corresponding to the logic value of the input signal.

The buffer 30 is provided between the high voltage power-source line and the low voltage power-source line mentioned above, and supplies a current from the high voltage power-source line to the device under test 300, according to the supplied signal. In addition, the buffer 30 draws the current into the low voltage power-source line from the device under test 300 according to the supplied signal. The buffer 30 in the present example includes two transistors 32. The transistors 32 may be a bipolar transistor, a field effect transistor such as MOSFET, or other types of transistors.

The collector terminal of the high voltage transistor 32-1 is electrically connected to the high voltage power-source line via the high-voltage-side detecting section 50-1. The emitter terminal of the high voltage transistor 32-1 is electrically connected to the device under test 300 via the transmission end resistance 12, so that a test signal is outputted from the emitter terminal. The emitter terminal of the low voltage transistor 32-2 is electrically connected to the emitter terminal of the high voltage transistor 32-1, and the collector terminal of low voltage transistor 32-2 is electrically connected to the low voltage power-source line via the low-voltage-side detecting section 50-2.

Moreover, the voltage corresponding to the output voltage from the pre-driver 22 is supplied to the base terminal of each transistor 32. The emitter voltage from the transistor 32, i.e., the voltage of a test signal, is determined by a base voltage, a collector current of the transistor 32, and collector current vs. base to emitter voltage characteristics of the transistor 32.

The voltage shift section 24 shifts the voltage outputted from the pre-driver 22 by predetermined voltages, and supplies the resulting voltages respectively to the base terminals of the high voltage transistor 32-1 and the low voltage transistor 32-2. The voltage shift section 24 in the present example includes a high voltage current source 26-1, a low voltage current source 26-2, a high voltage diode 28-1, and a low voltage diode 28-2.

The high voltage diode 28-1 is provided between the output end of the pre-driver 22 and the base terminal of the high voltage transistor 32-1, raises the voltage outputted from the pre-driver 22 according to the forward voltage, and supplies the raised voltage to the base terminal of the high voltage transistor 32-1. The high voltage current source 26-1 is electrically connected to the base terminal of the high voltage transistor 32-1 and to the high voltage diode 28-1, and supplies the forward current to the high voltage diode 28-1.

Likewise, the low voltage diode 28-2 is provided between the output end of the pre-driver 22 and the base terminal of the low voltage transistor 32-2, lowers the voltage outputted from the pre-driver 22 according to the forward voltage, and supplies the lowered voltage to the base terminal of the low voltage transistor 32-2. The low voltage current source 26-2 is electrically connected to the base terminal of the low voltage transistor 32-2 and to the low voltage diode 28-2, and supplies the forward current to the low voltage diode 28-2.

According to the stated configuration, the difference in base to emitter voltage between respective transistors 32 can be compensated in advance by the voltage shift section 24. In this case, the buffer 30 can output the load voltage substantially equal to the voltage supplied to the pre-driver 22.

The high-voltage-side detecting section 50-1 is provided between the high voltage power-source line and the high voltage transistor 32-1, to detect the collector current ICH of the high voltage transistor 32-1. The low-voltage-side detecting section 50-2 is provided between the low voltage power-source line and the low voltage transistor 32-2, to detect the collector current ICL of the low voltage transistor 32-2.

The output control section 10 controls the load voltage outputted from the driver section 20, by controlling the voltage supplied to the pre-driver 22, based on the collector current detected by the supply current detecting section 50.

The load current outputted from the driver section 20 changes according to the load voltage, and so the load current can be controlled by controlling the supplied voltage. Accordingly, by controlling the supplied voltage to yield a constant load electric-current value, the device under test 300 can be provided with a constant current. Also by controlling the supplied voltage to yield a constant load voltage value, the device under test 300 can be provided with a constant voltage.

Figure 4:
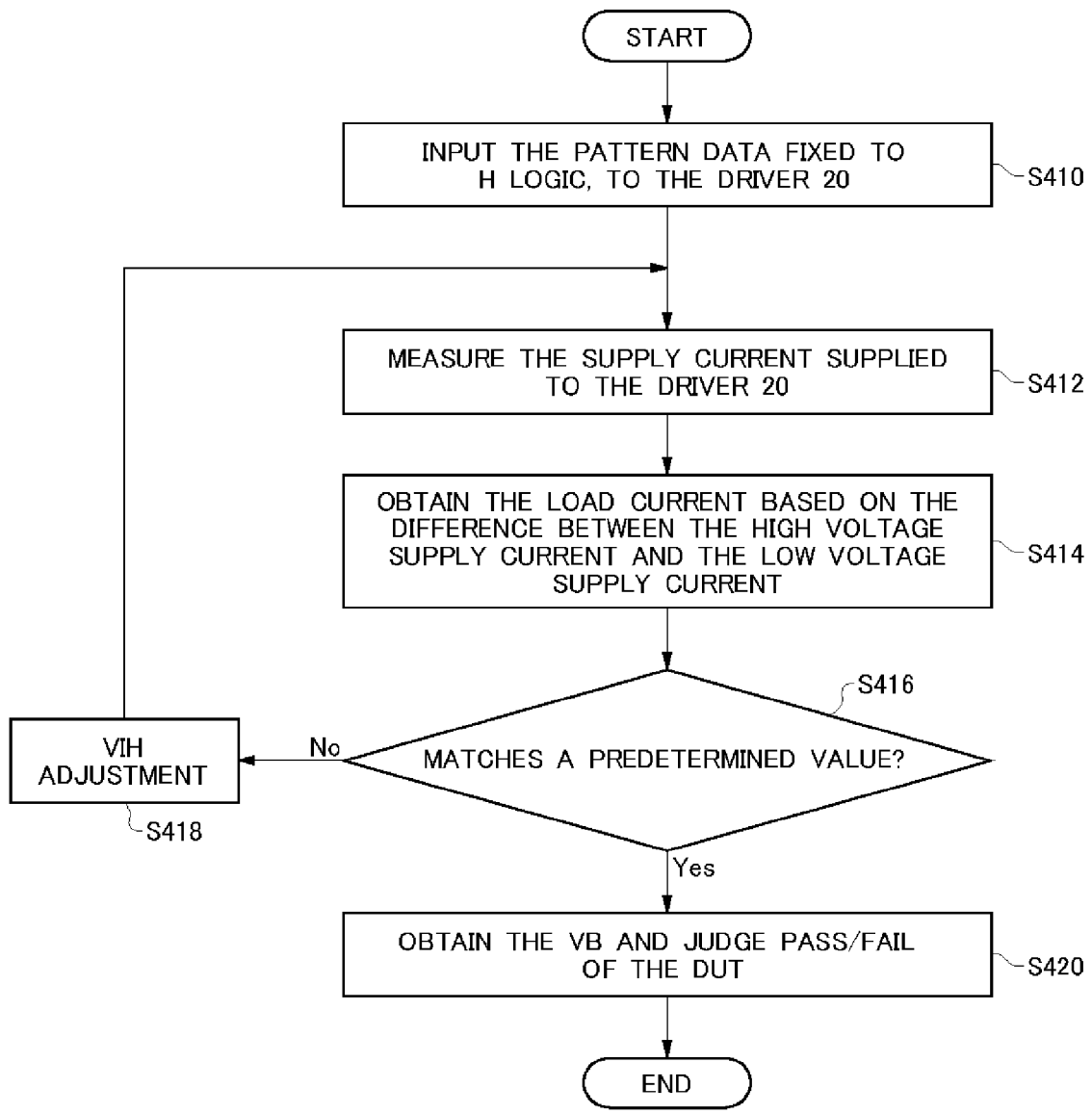
FIG. 4 is a flowchart showing exemplary processing for testing a device under test 300 in a constant current operation mode.

FIG. 4 is a flowchart showing exemplary processing for testing a device under test 300 in a constant current operation mode. In the constant current operation mode, the test apparatus 200 performs an ISVM test for judging pass/fail of the device under test 300 by measuring the load voltage resulting when a load current of a constant current is supplied to the device under test 300.

In this case, the output control section 10 may calculate the load current to the device under test 300, from the supply current detected by the supply current detecting section 50. The output control section 10 may control the voltage supplied to the driver section 20 so that the load current be a predetermined constant current.

In conducting an ISVM test, the pattern generating section 110 inputs pattern data whose logic value is fixed, to the driver section 20. The pattern generating section 110 in the present example inputs pattern data whose logic value is fixed to H logic, to the driver section 20 (S410). In conducting an ISVM test, the output control section 10 may control the pattern generating section 110 to output pattern data whose logic value is fixed. For example, the output control section 10 may control the pattern generating section 110 to output the pattern data whose logic value is fixed to either H logic or L logic.

The driver section 20 outputs, to the device under test 300, a load voltage corresponding to the supplied logic value. Here, the supply current detecting section 50 measures the supply current supplied to the driver section 20 (S412). As explained above, the supply current detecting section 50 detects the high voltage supply current ICH supplied to the high voltage transistor 32-1 and the low voltage supply current ICL supplied to the low voltage transistor 32-2.

Next, the output control section 10 calculates the load current supplied to the device under test 300, using the difference between the high voltage supply current and the low voltage supply current (ICH−ICL) (S414). First, the output control section 10 calculates the emitter current of each transistor 32, based on the high voltage supply current and the low voltage supply current, i.e., the collector current of the high voltage transistor 32-1 and the low voltage transistor 32-2. The emitter current is obtained as a summation of the collector current and the base current. In S414, the emitter current can be calculated by identifying the base current, since the collector current is already known.

For example, the output control section 10 may be provided with static characteristic data representing the relation between the collector current and the base current in the transistor 32. The output control section 10 may be provided with static characteristic data representing the relation between the collector current and the emitter current in each transistor 32. The output control section 10 may calculate each emitter current based on the static characteristic data and the collector current detected by the supply current detecting section 50. The output control section 10 calculates the difference between these emitter currents as a load current. Note that the base current is extremely smaller than the collector current or the emitter current, and so the output control section 10 may treat the same current as the collector current, as if it is the emitter current.

Next, the output control section 10 judges whether the calculated load current matches a pre-set value (S416). When the load current does not match the pre-set value, the output control section 10 adjusts the voltage supplied to the preamplifier so that the load current becomes closer to the pre-set value (S418). By adjusting the supplied voltage, the voltage supplied to the base terminal of the transistor 32 in the buffer 30 changes, thereby enabling to control the load current. For example, the output control section 10 may increase the supplied voltage when the load current is smaller than the pre-set value, and decrease the supplied voltage when the load current is larger than the pre-set value.

The driver circuit 100 then repeats the processing from S412. The explained control is performed dynamically during the test of the device under test 300, to control the load current supplied to the device under test 300 to a constant value. In addition, the judging section 120 judges pass/fail of the device under test 300 based on the load voltage resulting when the load current matches the pre-set value (S420).

Here, the output control section 10 may calculate the load voltage supplied to the device under test 300, based on the electric-current values of the emitter currents of the transistors 32, the voltage values of the emitter voltages of the transistors 32, and the resistance value of the transmission end resistance 12. As already explained, the electric-current value of the emitter current can be calculated based on the electric-current value of the collector current, and the static characteristic data representing the relation between the collector current and the base current of the transistor 32.

The output control section 10 may calculate the emitter voltage based on the collector current and the base voltage of each transistor 32. The output control section 10 may be provided with static characteristic data representing the relation between the collector current and the base to emitter voltage in each transistor 32. Here, the emitter voltage corresponds to the output voltage VA of the buffer 30 shown in FIG. 2 and FIG. 3.

Next, the output control section 10 calculates the load voltage VB based on the difference between the emitter currents ICH−ICL (i.e., the load current), the emitter voltage (i.e., the output voltage VA), and the resistance value RB at the transmission end resistance 12. More specifically, the output control section 10 may calculate the load voltage VB based on the expression represented by VB=VA−(ICH−ICL)*RB.

Figure 5A:
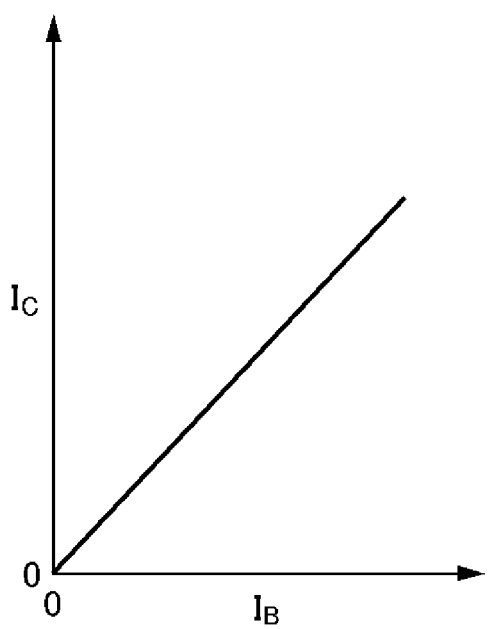
FIG. 5A shows an example of static characteristic data of a transistor 32 provided in advance in an output control section 10.
Figure 5B:
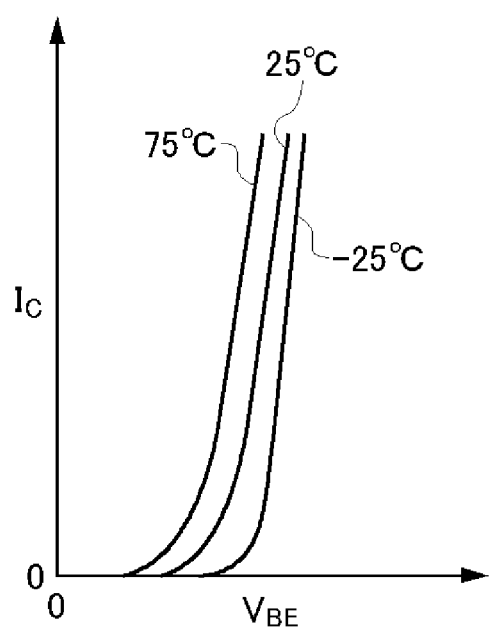
FIG. 5B shows an example of static characteristic data of a transistor 32 provided in advance in the output control section 10.

FIG. 5A and FIG. 5B respectively show an example of static characteristic data of a transistor 32 provided in advance in an output control section 10. The static characteristic data may be obtained by calculating the theoretical value of the characteristic value from the design information of the transistor 32, or by actually measuring the characteristic value of the transistor 32.

As shown in FIG. 5A, the output control section 10 may store, for each transistor 32, the static characteristic data representing the relation between the collector current and the base current. The emitter current of a transistor 32 can be calculated based on the static characteristic data and the collector current detected by the supply current detecting section 50.

Moreover as shown in FIG. 5B, the output control section 10 may store, for each transistor 32, static characteristic data representing the relation between the collector current and the base to emitter voltage for the transistor 32. The emitter voltage of a transistor 32 can be calculated based on the static characteristic data, the collector current detected by the supply current detecting section 50, and the base voltage obtained from the supplied voltage. In addition, the output control section 10 may store, instead of the above-explained static characteristic data, static characteristic data representing the relation between the base current and the base to emitter voltage for the transistor 32. Even in this case, the base current can be obtained from the static characteristic data shown in FIG. 5A and the collector current, and so the emitter voltage can be calculated using the static characteristic data representing the relation between the base current and the base to emitter voltage.

Figure 6:
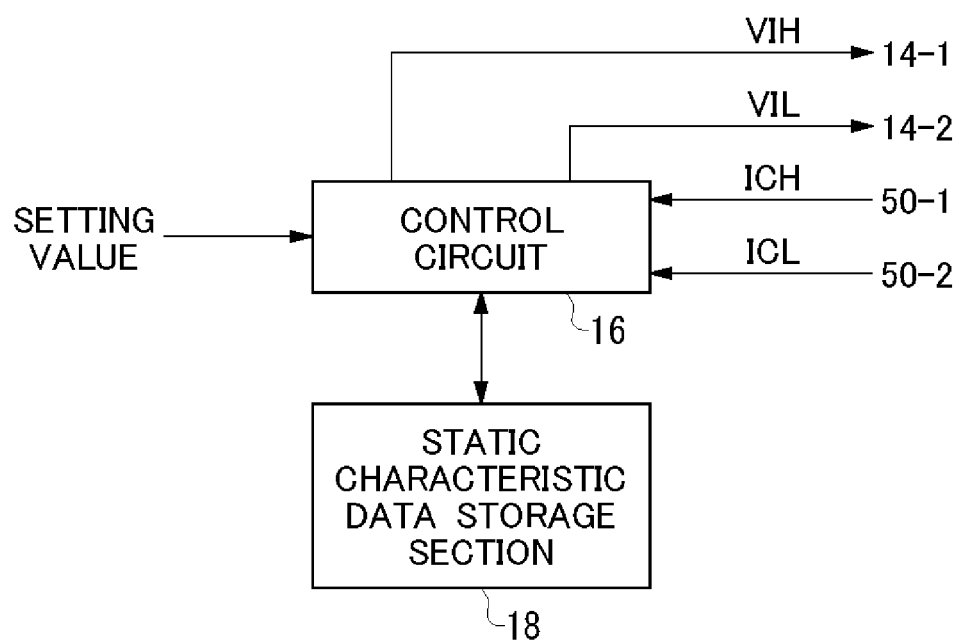
FIG. 6 is a block diagram showing an exemplary configuration of the output control section 10.

FIG. 6 is a block diagram showing an exemplary configuration of the output control section 10. The output control section 10 in the present example includes a control circuit 16 and a static characteristic data storage section 18. The static characteristic data storage section 18 stores the static characteristic data of the transistor 32, as shown in FIG. 5A and FIG. 5B for example.

Note that the static characteristic data of the transistor 32 stored in the static characteristic data storage section 18 is not limited to the data shown in FIG. 5A and FIG. 5B. Since the collector current of the transistor 32 is detected by the supply current detecting section 50, and the base voltage is determined by the voltage supplied to the pre-driver 22, the static characteristic data storage section 18 may store any static characteristic data as long as the emitter current and the emitter voltage can be calculated based on the collector current and the base voltage by using the static characteristic data.

The control circuit 16 controls the supplied voltages VIH and VIL supplied to the pre-driver 22, based on the supply currents ICH and ICL detected by the supply current detecting section 50, the static characteristic data stored in the static characteristic data storage section 18, and the setting value set by a user or the like. For example, as explained with reference to FIG. 4, the control circuit 16 may obtain the emitter current of each transistor 32 based on the static characteristic data and the collector current, and control one of the supplied voltages VIH and VIL, so that the difference between the emitter currents results in a predetermined constant current.

The control circuit 16 may calculate the emitter voltage of each transistor based on the static characteristic data, the collector current, and the supplied voltage. The control circuit 16 may calculate the load voltage supplied to the device under test 300 based on the electric-current value of the emitter current, the voltage value of the emitter voltage, and the resistance value of the transmission end resistance 12. The judging section 120 judges pass/fail of the device under test 300 based on the load voltage calculated by the control circuit 16. Accordingly, the ISVM test can be performed on the device under test 300.

Figure 7:
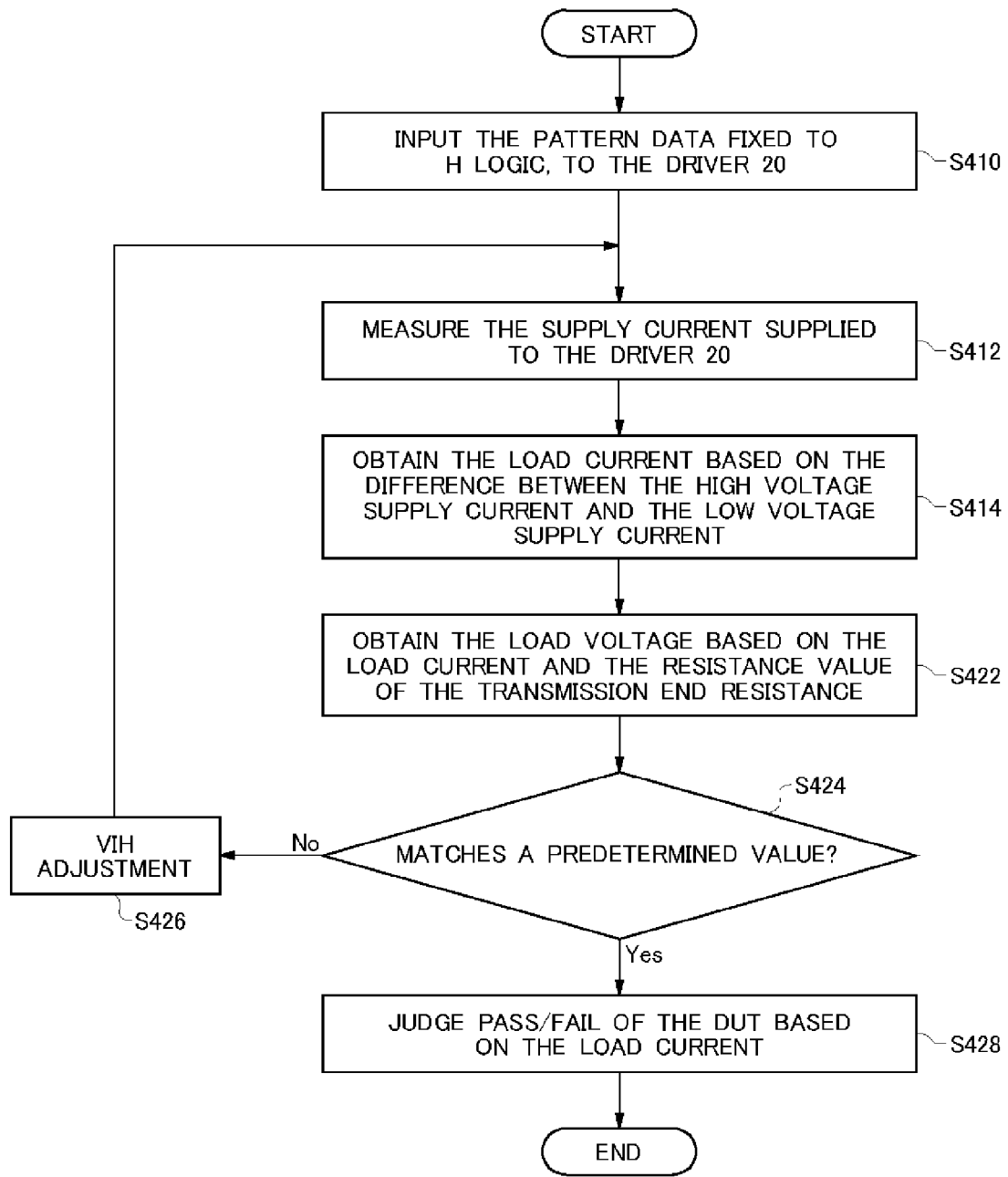
FIG. 7 is a flowchart showing exemplary processing for testing the device under test 300 in a constant voltage operation mode.

FIG. 7 is a flowchart showing exemplary processing for testing the device under test 300 in a constant voltage operation mode. In the constant voltage operation mode, the test apparatus 200 performs a VSIM test for judging pass/fail of the device under test 300 by measuring the load current resulting when a load voltage of a constant voltage is supplied to the device under test 300. In this case, the output control section 10 may calculate the load voltage to the device under test 300, based on the supply current detected by the supply current detecting section 50. The output control section 10 may control the voltage supplied to the driver section 20 so that the load voltage be a predetermined constant voltage.

Also in conducting a VSIM test, the processing from S410 through S414 may be the same as the processing from S410 through S414 explained above with reference to FIG. 4, and so the explanation thereof is omitted. After the load current is calculated by the control circuit 16 in S414, the control circuit 16 calculates the load voltage (S422). The calculation method of the load voltage may be the same as the method explained with reference to S420 of FIG. 4.

Next, the control circuit 16 judges whether the calculated load voltage matches a pre-set value (S424). When the load voltage does not match the pre-set value, the control circuit 16 adjusts the supplied voltage supplied to the pre-amplifier so that the load voltage becomes closer to the pre-set value (S426). By adjusting the supplied voltage, the voltage supplied to the base terminal of the transistor 32 in the buffer 30 changes, thereby enabling to control the load voltage.

After adjusting the supplied voltage, the driver circuit 100 repeats the processing from S412. The explained control is performed dynamically during the test of the device under test 300, to control the load voltage supplied to the device under test 300 to a constant value. In addition, the judging section 120 judges pass/fail of the device under test 300 based on the load current resulting when the load voltage matches the pre-set value (S428). The judging section 120 may judge pass/fail of the device under test 300 based on whether the load current calculated after the load voltage has matched the pre-set value falls within a predetermined range.

Figure 8:
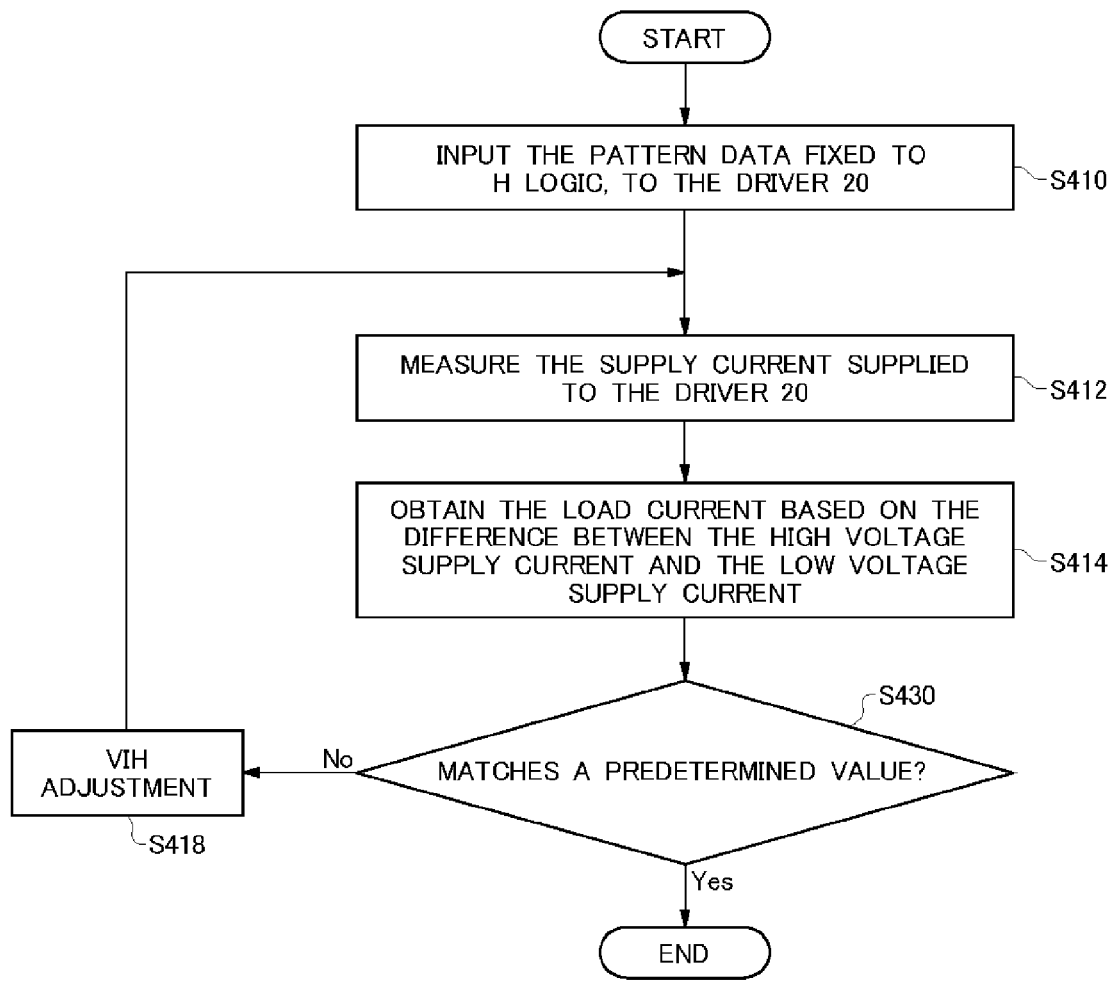
FIG. 8 is a flowchart showing exemplary processing in a case where the driver circuit 100 operates in a high-impedance operation mode.

FIG. 8 is a flowchart showing exemplary processing in a case where the driver circuit 100 operates in a high-impedance operation mode. In the high-impedance operation mode, the output control section 10 controls the supplied voltage to bring the output end of the driver section 20 into a high-impedance state. To be more specific, the output control section 10 controls the supplied voltage so that the load current obtained by the processing explained with reference to FIG. 4 becomes substantially 0.

In the present example, the processing from S410 through S414 may be the same as the processing from S410 through S414 explained above with reference to FIG. 4, and so the explanation thereof is omitted. After the load current is obtained in the processing of S414, the output control section 10 judges whether the electric-current value of the load current has become substantially 0 (S430). If the electric-current value of the load current is not 0, the output control section 10 controls the supplied voltage so that the electric-current value of the load current becomes closer to 0 (S418).

According to the explained control, the current flowing to the output end of the driver section 20 can be controlled to substantially 0. In other words, the output end of the driver section 20 can be controlled to a high-impedance state.

Figure 9:
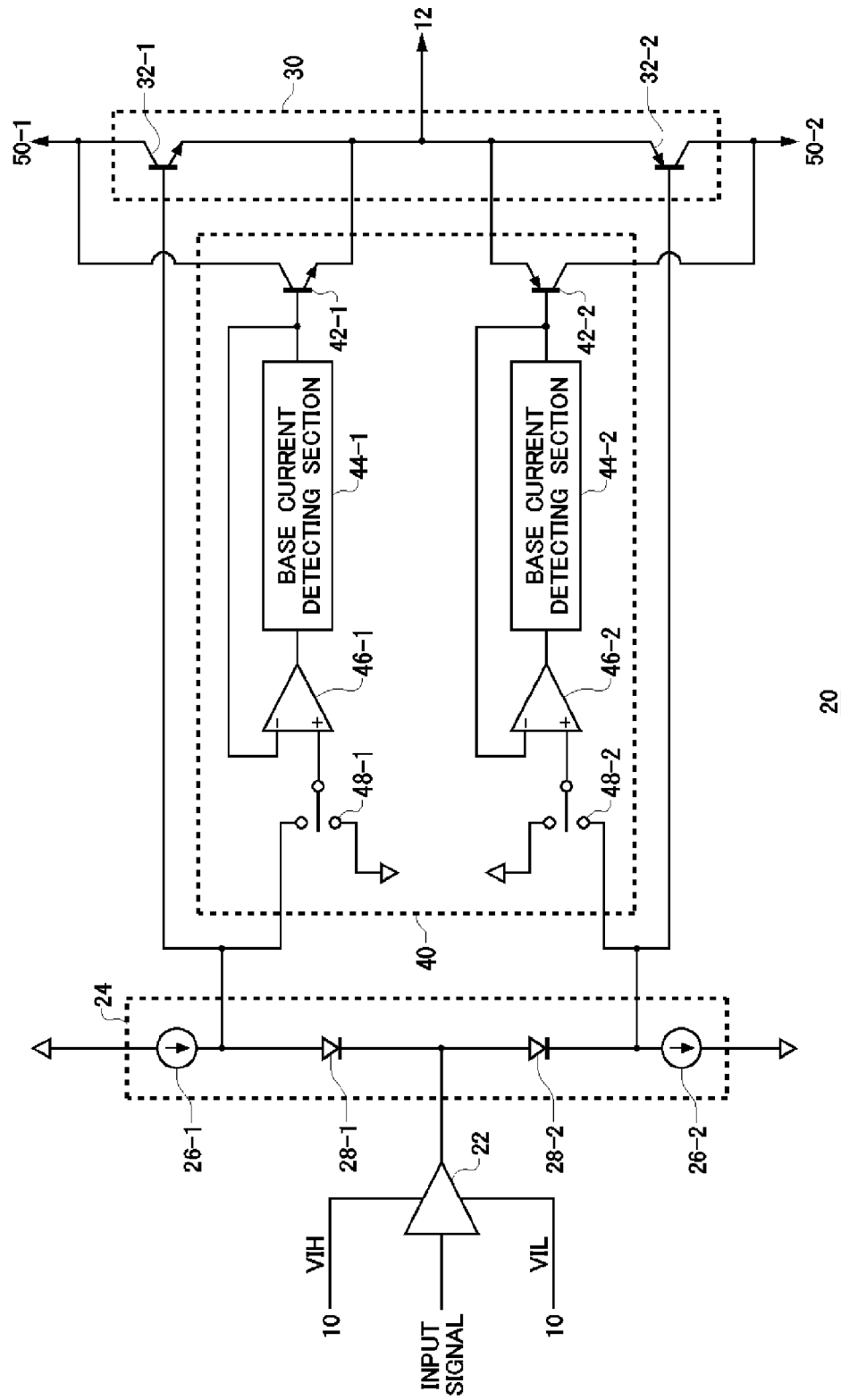
FIG. 9 shows another exemplary configuration of the driver section 20.

FIG. 9 shows another exemplary configuration of the driver section 20. The driver section 20 in the present example further includes a base current detecting section 40, in addition to the configuration of the driver section 20 explained above with reference to FIG. 3. The base current detecting section 40 detects the base currents respectively of the high voltage transistor 32-1 and the low voltage transistor 32-2 in the buffer 30, in the constant current operation mode, the constant voltage operation mode, and the high-impedance operation mode. When the driver section 20 includes the base current detecting section 40, the output control section 10 may control the supplied voltage as explained above with reference to FIG. 1 through FIG. 8 using the electric-current value of the base current detected by the base current detecting section 40, instead of using the electric-current value of the base current calculated from the static characteristic data.

The base current of each transistor 32 can also be calculated using the static characteristic data as shown in FIG. 5A. However, the static characteristic data is a theoretical value obtained by means of simulation or the like, and so may have an error. As opposed to this, the driver section 20 in the present example actually measures the base current of each transistor 32 during a test of the device under test 300, and so the load current or the load voltage can be adjusted with more accuracy.

The base current detecting section 40 in the present example includes a dummy transistor 42, a dummy current detecting section 44, a voltage follower circuit 46, and a switch section 48, for each transistor 32. The emitter terminal and the collector terminal of the dummy transistor 42 are electrically connected to the emitter terminal and the collector terminal of the corresponding transistor 32, respectively. The polarity of the dummy transistor 42 is desirably the same as the polarity of the corresponding transistor 32.

The dummy current detecting section 44 detects the dummy current supplied to the base terminal of the dummy transistor 42. For example, the dummy current detecting section 44 can detect the dummy current supplied to the base terminal of the dummy transistor 42, by measuring the difference between voltages at both ends of the measurement resistance provided between the voltage follower circuit 46 and the base terminal of the dummy transistor 42. A measurement resistance of a high resistance value (about several kΩ) can be used, because the resistance value of the measurement resistance has hardly any effect on the operation of the buffer 30.

The voltage follower circuit 46 supplies the voltage corresponding to an input voltage, to the base terminal of the dummy transistor 42. The voltage follower circuit 46 may be a differential circuit receiving this input voltage at the positive input terminal thereof, and receiving, at the negative input terminal thereof, feedback of the voltage supplied to the base terminal of the dummy transistor 42.

The switch section 48 switches which of the voltage outputted from the voltage shift section 24 and the reference voltage should be received by the positive input terminal of the voltage follower circuit 46. The switch section 48 supplies the voltage outputted from the voltage shift section 24 on the positive input terminal of the voltage follower circuit 46, in the constant current operation mode, the constant voltage operation mode, and the high-impedance operation mode.

In this case, the base terminal of the dummy transistor 42 is provided with a voltage corresponding to the base voltage of the transistor 32. For example, the voltage equal to the base voltage of the transistor 32 is supplied to the base terminal of the dummy transistor 42. That is, the collector voltage, the emitter voltage, and the base voltage of the dummy transistor 42 are the same as the collector voltage, the emitter voltage, and the base voltage of the transistor 32. Therefore, the dummy current supplied to the base terminal of the dummy transistor 42 simulates the base current of the transistor 32. Therefore, the base current of the transistor 32 can be detected by detecting the base current of the dummy transistor 42.

The dummy transistor 42 may have the same size as the transistor 32 so that the same current is flown to these transistors when the same voltage is provided to these transistors. In this case, the base current of the dummy transistor 42 matches the base current of the transistor 32. The size of the dummy transistor 42 may be 1/N times the size of the transistor 32. In this case, the base current of the dummy transistor 42 is 1/N times the base current of the transistor 32.

According to the stated configuration, the base current of the transistor 32 can be measured, to enable to control the load voltage and the load current with accuracy. The dummy current detecting section 44 may notify the output control section 10 of the detected electric-current value.

The driver circuit 100 further includes a pattern operation mode for outputting a pattern signal having a predetermined logic pattern. In the pattern operation mode, the switch section 48 supplies a predetermined reference voltage to the positive input terminal of the voltage follower circuit 46. The reference voltage may be able to control the dummy transistor 42 to OFF, to halt the signal transmission between the collector and the emitter of the dummy transistor 42. The switch section 48 enables to cut off the dummy current detecting section 44 from the buffer 30, and so a pattern signal of a high frequency can be generated in the pattern operation mode.

Figure 10:
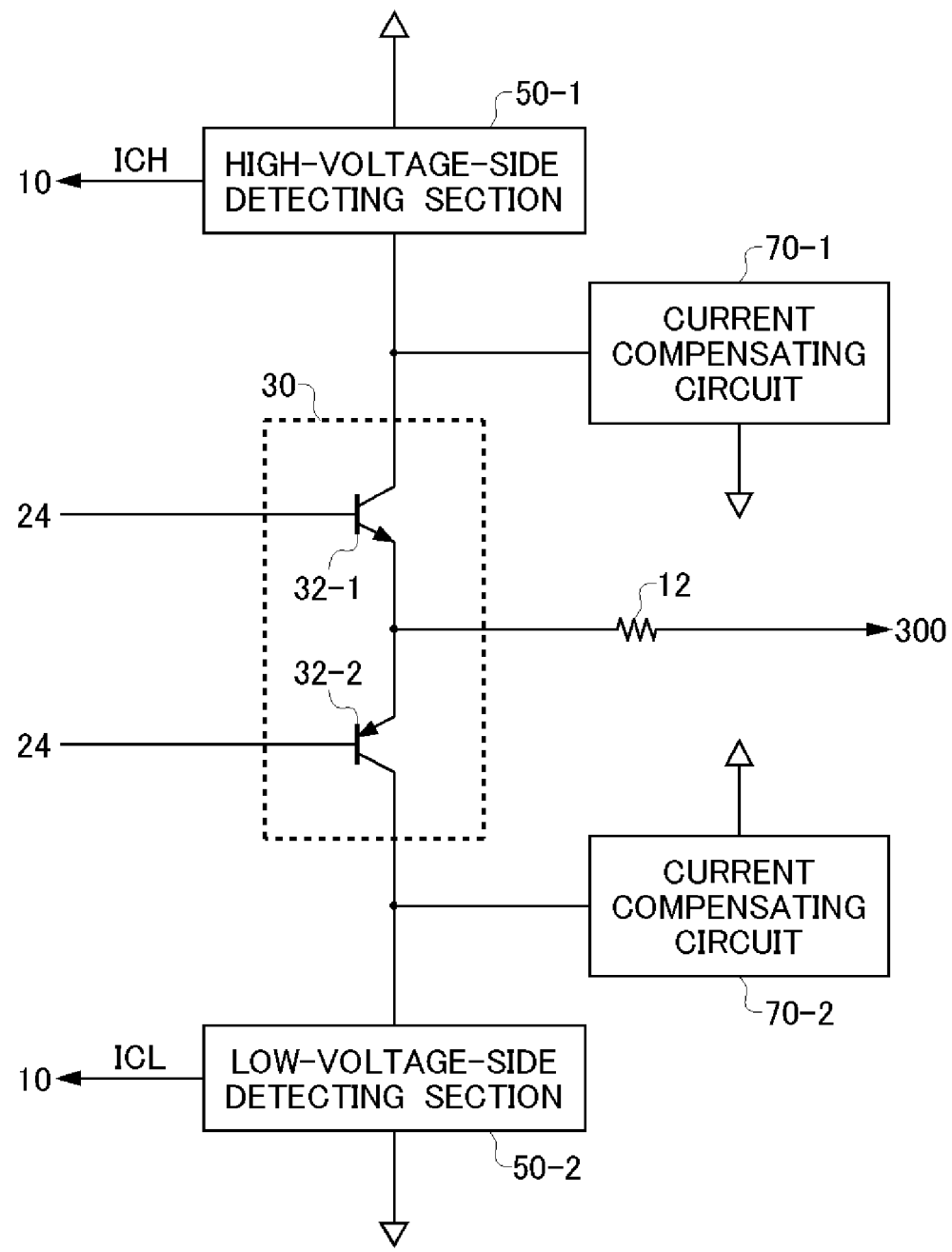
FIG. 10 shows a part of another exemplary configuration of the driver circuit 100.

FIG. 10 shows a part of another exemplary configuration of the driver circuit 100. The driver circuit 100 in the present example further includes a current compensating circuit 70, in addition to the configuration of the driver circuit 100 explained above with reference to FIG. 1 through FIG. 8.

The current compensating circuit 70 either adds a compensation current corresponding to each collector current detected by the supply current detecting section 50 to the collector current, or subtracts such a compensation current from the collector current. More specifically, the current compensating circuit 70 substantially matches the collector current detected by the supply current detecting section 50 with the emitter current of the transistor 32, by either adding a current equivalent to the base current corresponding to the collector current to the collector current between the supply current detecting section 50 and the transistor 32, or subtracting the current from the collector current. According to the stated configuration, the output control section 10 can calculate the emitter current of the transistor 32 based on the collector current detected by the supply current detecting section 50, without using the static characteristic of the transistor 32.

The driver circuit 100 in the present example includes a high voltage current compensating circuit 70-1 and a low voltage current compensating circuit 70-2. The high voltage current compensating circuit 70-1 draws in the compensation current corresponding to the collector current detected by the high-voltage-side detecting section 50-1, from the wire provided between the high-voltage-side detecting section 50-1 and the high voltage transistor 32-1. Accordingly, the collector current supplied to the high voltage transistor 32-1 becomes smaller than the collector current detected by the high-voltage-side detecting section 50-1 by the value of the compensation current. However, the collector current and the base current is added in the high voltage transistor 32-1, and so the emitter current of the high voltage transistor 32-1 will substantially match the collector current detected by the high-voltage-side detecting section 50-1.

The low voltage current compensating circuit 70-2 superposes the compensation current corresponding to the collector current detected by the low-voltage-side detecting section 50-2, onto the wire provided between the low-voltage-side detecting section 50-2 and the low voltage transistor 32-2. Accordingly, the emitter current of the low voltage transistor 32-2 will substantially match the collector current detected by the low-voltage-side detecting section 50-2.

Figure 11:
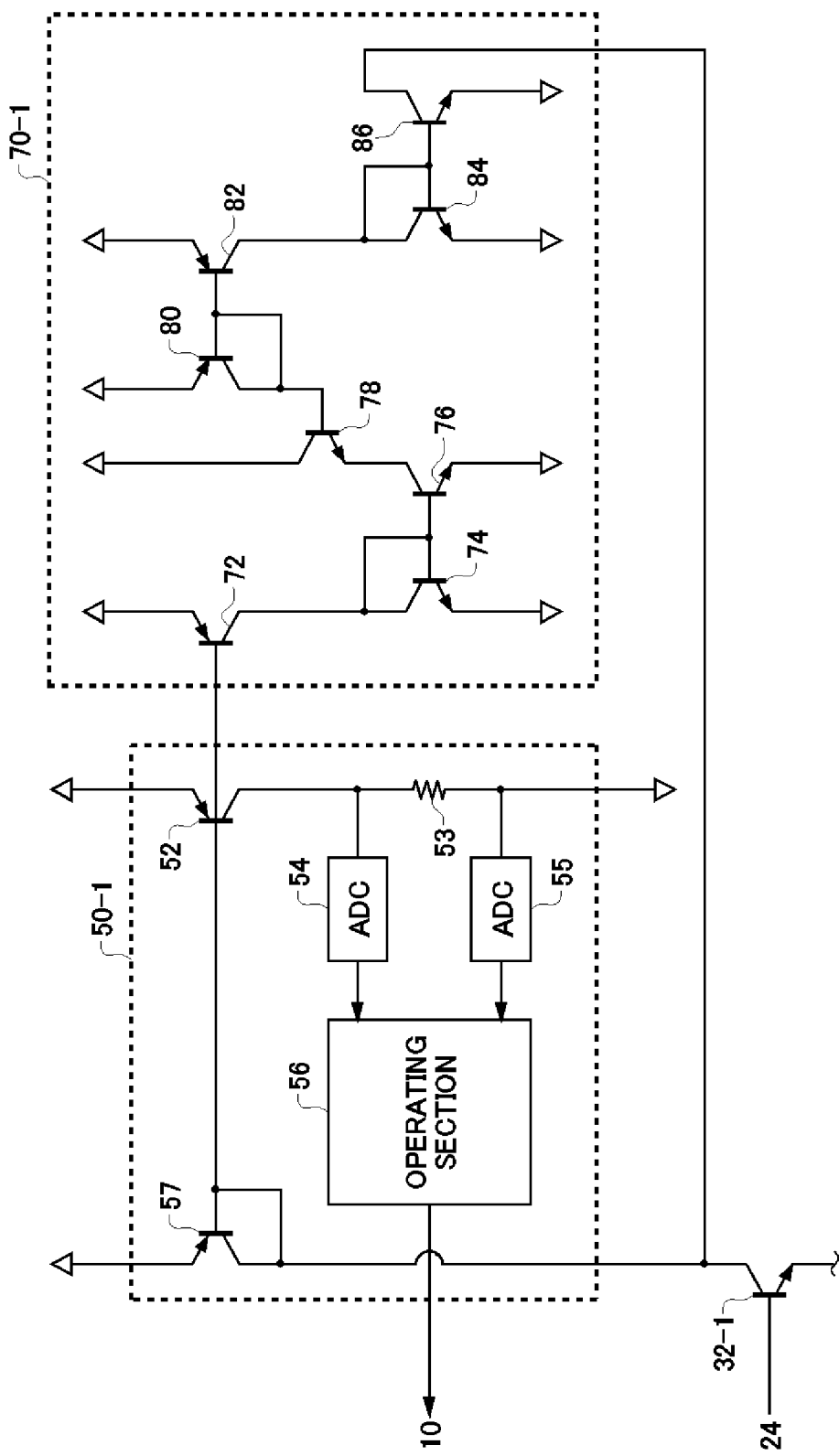
FIG. 11 shows an exemplary circuit configuration of a supply current detecting section 50 and a current compensating circuit 70.

FIG. 11 shows an exemplary circuit configuration of a supply current detecting section 50 and a current compensating circuit 70. In the present example, the configurations of the high-voltage-side detecting section 50-1 and the high voltage current compensating circuit 70-1 are explained. However, the low-voltage-side detecting section 50-2 and the low voltage current compensating circuit 70-2 may have the similar configurations.

The high-voltage-side detecting section 50-1 includes a detection transistor 57, a mirror transistor 52, a measurement resistance 53, an ADC 54, an ADC 55, and an operating section 56. The detection transistor 57 is provided between the high voltage power-source line and the high voltage transistor 32-1, and generates the same collector current as the collector current of the high voltage transistor 32-1.

The mirror transistor 52 forms a current mirror with the detection transistor 57. In other words, the same collector current is flown to the mirror transistor 52 as that to the detection transistor 57. The measurement resistance 53 is provided between the mirror transistor 52 and the reference potential. The ADC 54 and the ADC 55 detect the voltage values at both ends of the measurement resistance 53. The operating section 56 detects the collector current of the high voltage transistor 32-1, from the difference between the voltages detected by the ADC 54 and the ADC 55 as well as from the resistance value of the measurement resistance 53.

The operating section 56 notifies the output control section 10 of the detected electric-current value. According to the stated configuration, the measurement resistance 53 can be provided on a wire different from the wire on which the high voltage transistor 32 is located, which enables to use a measurement resistance 53 having relatively high resistance. This leads to detection of the electric-current value with more accuracy.

The current compensating circuit 70-1 includes a first transistor 72, a second transistor 74, a third transistor 76, and a fourth transistor 78. The first transistor 72 forms a current mirror with the detection transistor 57. The second transistor 74 has a polarity different from the polarity of the first transistor 72, and the collector terminal of the second transistor 74 is electrically connected to the collector terminal of the first transistor 72, and the emitter terminal of the second transistor 74 is electrically connected to the low voltage power-source line.

An example of the transistors having different polarities from each other is bipolar transistors having different majority carriers from each other, such as in a case where one transistor is of pnp type and the other transistor is of npn type. Another example may be a unipolar transistor having different carriers from each other (e.g., an n-channel transistor and a p-channel transistor).

The third transistor 76 forms a current mirror with the second transistor 74. The fourth transistor 78 has a polarity different from the polarity of the third transistor 76, and the emitter terminal of the fourth transistor 78 is connected to the collector terminal of the third transistor 76, and the collector terminal of the fourth transistor 78 is connected to the high voltage power-source line. The base terminal of the fourth transistor 78 is connected to the collector terminal of the fifth transistor 80. According to the stated configuration, the base terminal of the fourth transistor 78 can simulate the base terminal of the high voltage transistor 32-1.

The current compensating circuit 70-1 draws in the current corresponding to the base current of the fourth transistor 78, from the wire connected to the collector terminal of the high voltage transistor 32-1. Note that the size of the first transistor 72 through the fifth transistor 80 may be 1/M times the size of the high voltage transistor 32-1, so as to reduce the current consumed by the current compensating circuit 70-1.

In this case, as shown in FIG. 11, the current compensating circuit 70-1 includes a fifth transistor 80, a sixth transistor 82, a seventh transistor 84, and an eighth transistor 86 which generate the current corresponding to M times the base current of the fourth transistor 78. The fifth transistor 80 has a polarity different from the polarity of the fourth transistor 78, and the collector terminal of the fifth transistor 80 is connected to the base terminal of the fourth transistor 78. Accordingly, the collector current corresponding to the base current of the fourth transistor 78 is flown to the fifth transistor 80.

The sixth transistor 82 forms a current mirror with the fifth transistor 80. The seventh transistor 84 has a polarity different from the polarity of the sixth transistor 82, and the collector terminal of the seventh transistor 84 is connected to the collector terminal of the sixth transistor 82. Accordingly, the collector current that is the same as the collector current of the sixth transistor 82 is flown to the seventh transistor 84.

The eighth transistor 86 forms a current mirror with the seventh transistor 84. The eighth transistor 86 has the same size as the high voltage transistor 32-1, and the collector terminal of the eighth transistor 86 is connected to the collector terminal of the high voltage transistor 32-1, and the emitter terminal of the eighth transistor 86 is connected to the low voltage power-source line.

According to the stated configuration, the current obtained by simulating the base current of the high voltage transistor 32-1 can be drawn in from the wire connected to the collector terminal of the high voltage transistor 32-1. A Wilson current mirror circuit may be used as each current mirror circuit of the current compensating circuit 70-1 in the present example.

Figure 12:
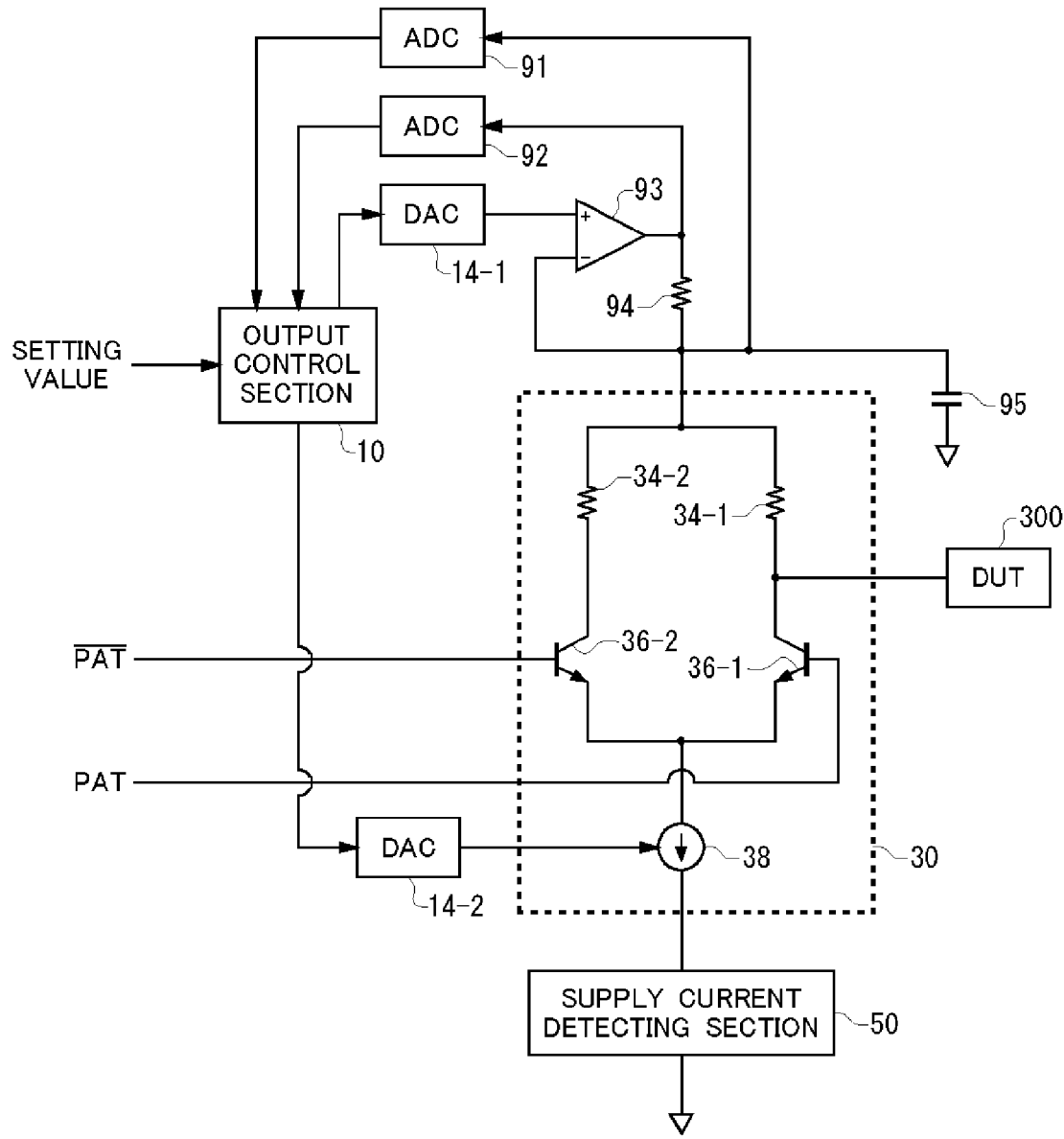
FIG. 12 shows another exemplary configuration of the driver circuit 100.

FIG. 12 shows another exemplary configuration of the driver circuit 100. The driver circuit 100 in the present example includes an output control section 10, a setting section 14, an ADC 91, an ADC 92, an operation amplifier 93, a resistance 94, a capacitor 95, a supply current detecting section 50, and a driver section 20. The driver section 20 in the present example may be an open-collector driver. For example, the driver section 20 includes, as non-inverted circuits, a resistance 34-1 and a transistor 36-1 connected in series, as well as including, as inverted circuits, a resistance 34-2 and a transistor 36-2 connected in series.

The non-inverted circuits and the inverted circuits are provided in parallel to each other, and the current source 38 defining the summation of the supply currents flown to these currents is commonly connected to the emitter terminals of the transistor 36-1 and the transistor 36-2. An input signal is provided to the transistor 36-1, and an inverted signal of the input signal is provided to the transistor 36-2. Accordingly, the driver section 20 functions as a driver consuming a comparatively large current while operating at comparatively high speed.

The resistance 94 is connected in series to each of the resistance 34-1 and the resistance 34-2 of the driver section 20. In addition, the operation amplifier 93 supplies the high-voltage-side supply voltage corresponding to the setting value provided by the setting section 14-1, to the driver section 20 via the resistance 94. The capacitor 95 is provided between the junction between the resistance 94 and the resistance 34-1, and the reference potential.

The ADC 91 and the ADC 92 detect the voltages at both ends of the resistance 94 and notify the output control section 10 of the detected voltages. Accordingly, the output control section 10 can calculate the current flown to the resistance 94. It is desirable that the resistance value of the resistance 94 be supplied in advance to the output control section 10. In addition, the supply current detecting section 50 detects the supply current flown to the current source 38.

In the constant current operation mode, the constant voltage operation mode, and the high-impedance operation mode, the logic value of an input signal is fixed to H logic for example. In this state, the transistor 36-1 is OFF, and the transistor 36-2 is ON. The logic value of the input signal may be fixed to L logic. In this state, the transistor 36-1 is ON, and the transistor 36-2 is OFF.

In this case, the current I1 flown to the resistance 34-1 is equal to the current flown to the resistance 94. In addition, the collector current I2 of the transistor 36-1 is equal to the value resulting from subtracting the base current of the transistor 36 from the current detected by the supply current detecting section 50. The base current of the transistor 36 can be calculated from the emitter current of the transistor 36 and the static characteristic data of the transistor 36, as explained above with reference to FIG. 5A and FIG. 5B.

The load current supplied to the device under test 300 can be calculated by subtracting the current I2 from the current I1. The output control section 10 may adjust the electric-current value flown to the current source 38 so that the load current becomes a predetermined value.

The load voltage supplied to the device under test 300 can be calculated by subtracting, from the setting value of the setting section 14-1, the amount corresponding to the voltage decrease in the resistance 94 and the resistance 34-1 due to the current I1. The output control section 10 may adjust the electric-current value flown to the current source 38 so that the load voltage becomes a predetermined value.

Note that the resistance 94 and the resistance 34-1 in the driver circuit 100 consume the amount of power corresponding to the difference between the load voltage and the output voltage from the operation amplifier 93. Therefore, the output control section 10 may adjust the setting value of the setting section 14-1 so that the difference between the output voltage and the load voltage while adjusting the electric-current value of the current source 38.

Figure 13:
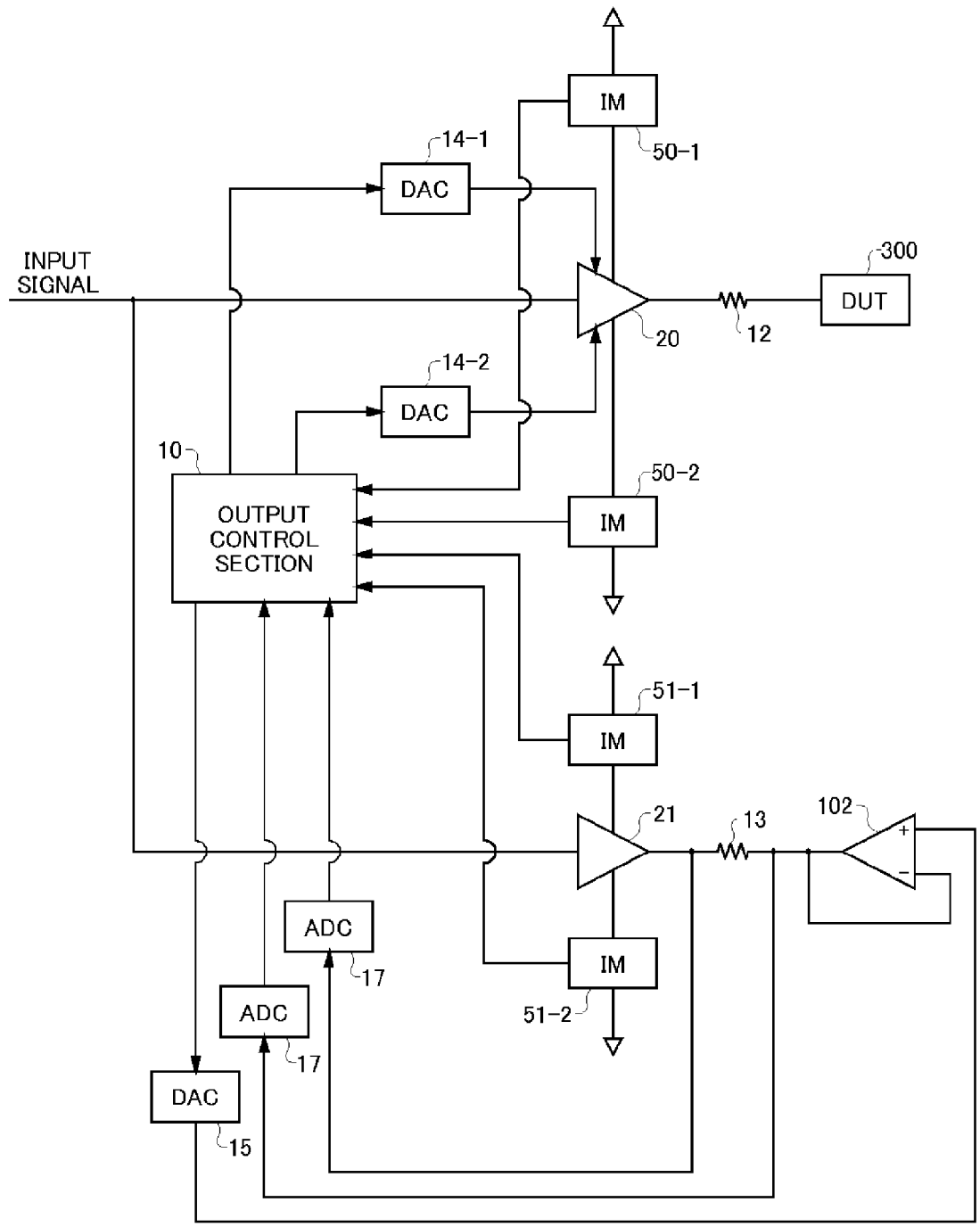
FIG. 13 shows another exemplary configuration of the driver circuit 100.

FIG. 13 shows another exemplary configuration of the driver circuit 100. The driver circuit 100 in the present example further includes a replica circuit, in addition to the configuration of the driver circuit 100 explained above with reference to FIG. 2. The replica circuit includes a replica driver section 21, a supply current detecting section 51, a replica transmission end resistance 13, a setting section 15, an ADC 17, and a replica load circuit 102.

The supply current detecting section 51 and the replica transmission end resistance 13 may be simulation circuits that are the same as the supply current detecting section 50 and the transmission end resistance 12, or may be simulation circuits consuming less power. The replica driver section 21 has a characteristic corresponding to the characteristic of the driver section 20, and outputs a simulation voltage obtained by simulating the voltage outputted from the driver section 20, by outputting the voltage corresponding to the supplied voltage supplied to the driver section 20.

For example, the replica driver section 21 may be the same circuit as the driver section 20, or a simulation circuit consuming less power. The replica driver section 21 may be the same circuit as the buffer 30 of the driver section 20. In this case, the replica driver section 21 may receive the voltage outputted from the voltage shift section 24 of the driver section 20 in parallel with the buffer 30, and output the voltage obtained by simulating the voltage outputted from the driver section 20.

The replica transmission end resistance 13 is provided at the output end of the replica driver section 21, has a characteristic corresponding to the characteristic of the transmission end resistance 12, and simulates the voltage at both ends of the transmission end resistance 12. For example, the replica transmission end resistance 13 may have the same resistance value as the resistance value of the transmission end resistance 12.

The replica load circuit 102 supplies, to the replica transmission end resistance 13, the voltage obtained by simulating the voltage at the terminal of the device under test 300. The replica load circuit 102 may be a voltage follower circuit outputting a simulation voltage corresponding to the voltage supplied from the output control section 10 via the setting section 15. In addition, the ADC 17 detects the difference between voltages at both ends of the replica transmission end resistance 13, and notifies the output control section 10 of the detected voltage difference.

The output control section 10 controls the voltage outputted from the replica load circuit 102, so that the supply current detected by the high-voltage-side detecting section 50-1 matches the supply current of the replica circuit detected by the high-voltage-side detecting section 51-1, and so that the supply current detected by the low-voltage-side detecting section 50-2 matches the supply current of the replica circuit detected by the low-voltage-side detecting section 51-2.

According to the stated processing, the simulation current and the simulation voltage outputted from the replica driver section 21 are those simulating, with accuracy, the load current and the load voltage outputted from the driver section 20. Consequently, the load current or the load voltage outputted from the driver section 20 can be detected, by detecting the simulation current or the simulation voltage of the replica driver section 21.

In addition, the difference between voltages at both ends of the replica transmission end resistance 13 in the replica circuit can simulate the difference between voltages at both ends of the transmission end resistance 12, with accuracy. Therefore, the output control section 10 can calculate the load current supplied to the device under test 300, from the voltage difference between both ends of the replica transmission end resistance 13 notified by the ADC 17. The output control section 10 may control the supplied voltage supplied to the pre-driver 22 of the driver section 20 so that the load current matches a predetermined value.

In addition, the output control section 10 can calculate the load voltage supplied to the device under test 300, from the voltage at an end of the replica transmission end resistance 13 nearer the replica load circuit 102 notified by the ADC 17. The replica transmission end resistance 13 is provided independently of the driver section 20. Therefore, even if the input capacity of the ADC 17 is added to the replica transmission end resistance 13 due to provision of the ADC 17 for directly measuring the voltage of the replica transmission end resistance 13, the driver section 20 will not be affected.

Consequently, the voltage of the replica transmission end resistance 13 can be directly measured with accuracy. The output control section 10 may control the supplied voltage supplied to the pre-driver 22 so that the load voltage matches a predetermined value. According to the stated configuration, too, the load current or the load voltage to the device under test 300 can be controlled to a constant value.

Figure 14:
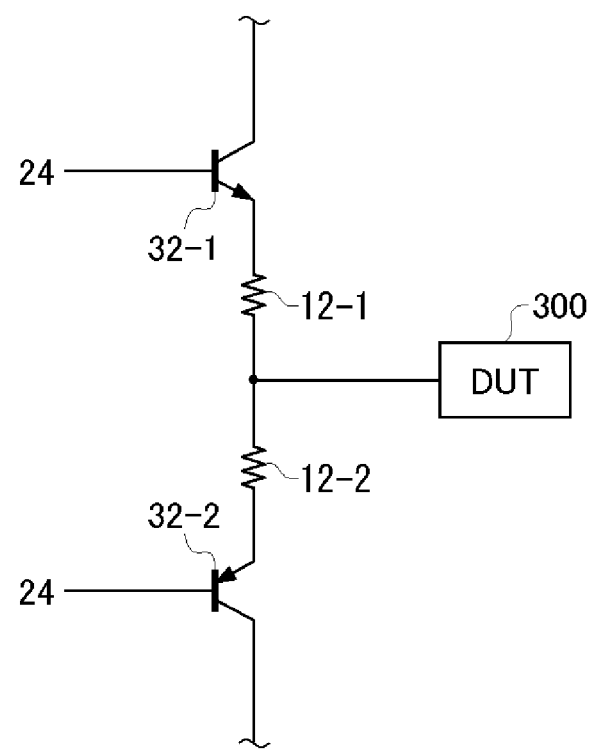
FIG. 14 shows another example of a transmission end resistance 12.

FIG. 14 shows another example of a transmission end resistance 12. The transmission end resistance 12 in the present example is provided inside the buffer 30. The buffer 30 includes two transmission end resistances 12 connected in series, between the high voltage transistor 32-1 and the low voltage transistor 32-2. The junction between the two transmission end resistances 12 is connected to the device under test 300.

When the two transmission end resistances 12 and the two replica transmission end resistances 13 are used in the driver circuit 100 explained above with reference to FIG. 13, the ADC 17 detects the difference between voltages at both ends for the respective replica transmission end resistances 13. In the configuration shown in FIG. 14, the load current supplied to the device under test 300 is obtained by subtracting the current flowing to the second replica transmission end resistance 13, from the current flowing to the first replica transmission end resistance 13. The output control section 10 may calculate the load current, using the voltages at both ends of each replica transmission end resistance 13 detected by the ADC 17.

Figure 15:
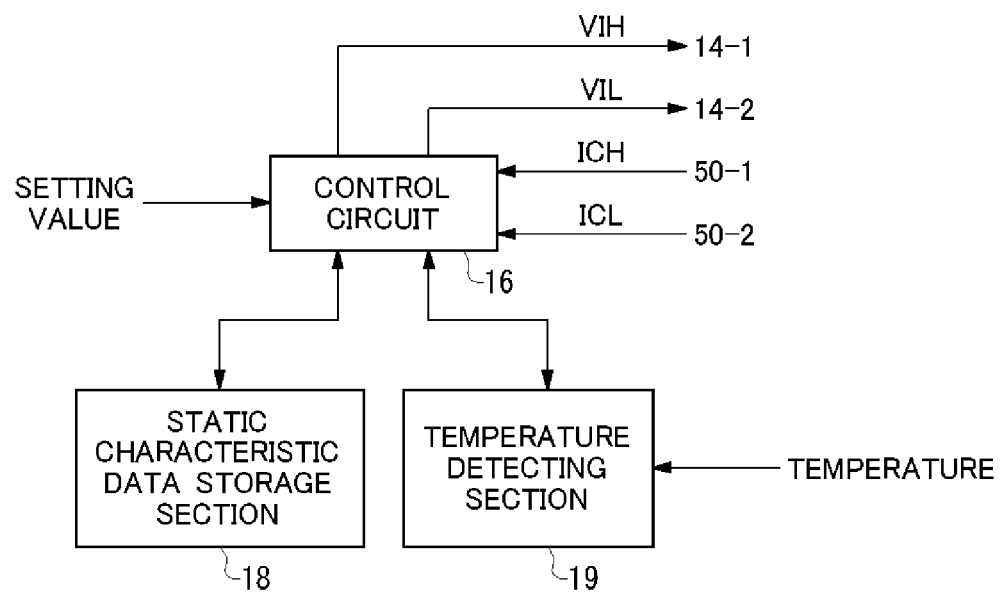
FIG. 15 is a block diagram showing another exemplary configuration of the output control section 10.

FIG. 15 is a block diagram showing another exemplary configuration of the output control section 10. The output control section 10 in the present example further includes a temperature detecting section 19, in addition to the configuration of the output control section 10 explained above with reference to FIG. 6.

The temperature detecting section 19 detects the temperature of the driver section 20. Specifically, the temperature detecting section 19 may detect the temperature of each transistor 32 of the driver section 20. For example, the temperature detecting section 19 may detect the temperature of the transistor 32 by measuring the characteristic of a device provided in the vicinity of the transistor 32 whose characteristic changes by the temperature.

The static characteristic data storage section 18 in the present example stores a plurality of types of static characteristic data corresponding to a plurality of temperatures of the driver section 20. For example, the static characteristic data storage section 18 may store the static characteristic data for each temperature as shown in FIG. 5B.

The control circuit 16 reads, from the static characteristic data storage section 18, the static characteristic data corresponding to the temperature detected by the temperature detecting section 19, and controls the supplied voltage based on the static characteristic data. According to the stated configuration, the load current or the load voltage can be controlled with more accuracy.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As clear from the above description, the embodiment(s) of the present invention realizes a test apparatus that can perform a direct current test on a device under test, and a driver circuit that supplies a signal to a load.

What is claimed is:

1. A test apparatus for judging pass/fail of a device under test depending on a load voltage or a load current supplied to the device under test, the test apparatus comprising:
   a driver circuit that supplies, to the device under test, a test signal corresponding to an input signal; and
   a judging section that judges pass/fail of the device under test, the judgment based on one of the load voltage and the load current, the load voltage supplied to the device under test when the test signal has a predetermined current, the load current supplied to the device under test when the test signal has a predetermined voltage:
   wherein the driver circuit includes:
   a driver section that outputs the test signal and selects a voltage of the test signal according to the input signal, from among a plurality of voltages supplied to the driver section, the driver section including a buffer that supplies a supply current to the device under test from a high voltage power-source line, and draws a draw current from the device under test into a low voltage power-source line, the buffer including:
      a high voltage transistor having a first collector terminal electrically connected to the high voltage power-source line, and a first emitter terminal electrically connected to the device under test through which the test signal is outputted, and
      a low voltage transistor having a second emitter terminal electrically connected to the first emitter terminal, and a second collector terminal electrically connected to the low voltage power-source line,
   a supply current detecting section that detects the supply current, the supply current detecting section including:
      a high-voltage-side detecting section provided between the high voltage power-source line and the high voltage transistor, and detects a high voltage current of the first collector, and
      a low-voltage-side detecting section provided between the low voltage power-source line and the low voltage transistor, and detects a low voltage current of the second collector,
   a base current detecting section that detects a high voltage base current of the high voltage transistor and a low voltage base current of the low voltage transistor, and
   an output control section that controls one of a voltage and a current of the test signal based on the supply current detected by the supply current detecting section, and controls the plurality of voltages so that a difference between a high emitter current and a low emitter current becomes a predetermined constant current, the high emitter current obtained as a summation of the high voltage current and the high voltage base current, and the low emitter current obtained as a summation of the low voltage current and the low voltage base current.

2. The test apparatus according to claim 1, wherein the driver section further includes a pre-driver that supplies a voltage corresponding to one of the plurality of voltages supplied thereto that corresponds to a logic value of the input signal, to a base terminal of the high voltage transistor and a base terminal of the low voltage transistor, wherein the output control section controls the voltage supplied to the pre-driver, based on the supply current detected by the supply current detecting section.

3. The test apparatus according to claim 2, wherein the driver section further includes a voltage shift section that shifts the voltage supplied from the pre-driver by a first predetermined pre-driver voltage, supplies the shifted voltage to the base terminal of the high voltage transistor, shifts the voltage supplied from the pre-driver by a second predetermined pre-driver voltage, and supplies the shifted voltage to the base terminal of the low voltage transistor.

4. The test apparatus according to claim 1, wherein the driver circuit includes a pattern operation mode to output a pattern signal having a predetermined logic pattern, and a constant current operation mode to output a predetermined constant current, and when operating in the constant current operation mode, the output control section controls the plurality of voltages supplied to the driver section, so that the load current to the device under test determined by the supply current detected by the supply current detecting section becomes a predetermined constant current.

5. The test apparatus according to claim 4, wherein the output control section includes:

a static characteristic data storage section that stores static characteristic data representing a relation between the high voltage current and the high voltage base current, and a relation between the low voltage current and the low voltage base current; and a control circuit that controls the plurality of voltages;

wherein the high voltage base current and the low voltage base current are calculated from the static characteristic data.

6. The test apparatus according to claim 5, further comprising:

a transmission end resistance provided between the driver section and the device under test;

wherein the static characteristic data storage section stores the static characteristic data further representing a relation between the high voltage current and a base to high emitter voltage for the high voltage transistor and a relation between the low voltage current and a base to low emitter voltage of the low voltage transistor;

wherein the control circuit calculates a high emitter voltage of the high voltage transistor and a low emitter voltage of the low voltage transistor from the static characteristic data and the high voltage current and the low voltage current, respectively, and calculates the load voltage supplied to the device under test, based on the high and low emitter current, the high and low emitter voltage, and the transmission end resistance; and wherein the judging section judges pass/fail of the device under test based on the load voltage calculated by the control circuit.

7. The test apparatus according to claim 5, further comprising:

a temperature detecting section that detects a temperature of the driver section;

wherein the static characteristic data storage section further stores a plurality of kinds of static characteristic data corresponding to a plurality of temperatures of the driver section; and wherein the control circuit reads, from the static characteristic data storage section, the static characteristic data corresponding to the temperature detected by the temperature detecting section, and controls the plurality of voltages based on the static characteristic data.

8. The test apparatus according to claim 4, wherein the driver circuit includes a current compensating circuit that matches the high voltage current to the high emitter current and the low voltage current to the low emitter current, by adjusting the high voltage current by a high compensation current and adjusting the low voltage current by a low compensation current, the high compensation current corresponding to the high voltage current and the low compensation current corresponding to the low voltage current, the high compensation current and the low compensation current detected by the supply current detecting section.

9. The test apparatus according to claim 4, further comprising:

a transmission end resistance provided between the driver section and the device under test;

wherein the driver circuit includes
   a replica driver section corresponding to the driver section that outputs the voltage selected by the driver section from the plurality of voltages supplied to the driver section,
   a replica transmission end resistance that is provided at an output end of the replica driver section corresponding to the transmission end resistance, and
   a replica load circuit that simulates the load voltage; and wherein when operating in the constant current operation mode, the output control section detects the load current to the device under test, by calculating a simulation current outputted from the replica driver section based on a detected voltage difference of the replica transmission end resistance.

10. The test apparatus according to claim 4, wherein the output control section fixes a logic value of the input signal supplied to the driver section to a predetermined value, when operating in an operation mode different from the pattern operation mode.

11. The test apparatus according to claim 1, further comprising:

a transmission end resistance provided between the driver section and the device under test;

wherein the driver circuit includes a pattern operation mode to output a pattern signal having a predetermined logic pattern and a constant voltage operation mode to output a predetermined constant voltage; and when operating in the constant voltage operation mode, the output control section calculates the load voltage supplied to the device under test based on the transmission end resistance and the high voltage current.

12. The test apparatus according to claim 11, wherein the output control section includes:

a static characteristic data storage section that stores static characteristic data representing (a) a relation between the high voltage current and a base to high emitter voltage for the high voltage transistor and a relation between the low voltage current and a base to low emitter voltage of the low voltage transistor, and (b) a relation between the high voltage current and the high voltage base current, and a relation between the low voltage current and the low voltage base current; and a control circuit that calculates the high and low emitter voltage and a high and low emitter current of each transistor in the buffer based on the static characteristic data, and calculates the load voltage based on the high and low emitter current, the high and low emitter voltage, and the transmission end resistance.

13. The test apparatus according to claim 12, wherein the judging section judges pass/fail of the device under test based on the load current determined by a difference between the high and low emitter currents calculated by the control circuit.

14. The test apparatus according to claim 11, wherein the driver circuit further includes a current compensating circuit that adjusts the high voltage current by a high compensation current and adjusts the low voltage current by a low compensation current, the high compensation current corresponding to the high voltage current detected by the supply current detecting section, the low compensation current corresponding to the low voltage current detected by the supply current detecting section.

15. The test apparatus according to claim 11, further comprising:

a transmission end resistance provided between the driver section and the device under test;

a replica driver section corresponding to the driver section that outputs the voltage selected by the driver section from the plurality of voltages supplied to the driver section; and a replica transmission end resistance that is provided at an output end of the replica driver section corresponding to the transmission end resistance, wherein when operating in the constant voltage operation mode, the output control section detects the load voltage to the device under test by detecting a voltage at an end of the replica transmission end resistance.

16. The test apparatus according to claim 1, wherein the base current detecting section includes, for each transistor in the buffer:
   a dummy transistor having an emitter terminal electrically connected to the emitter terminal of the transistor, and a collector terminal electrically connected to the collector terminal of the transistor;
   a voltage follower circuit that supplies a voltage corresponding to a base voltage of the transistor to a base terminal of the dummy transistor; and
   a dummy current detecting section that detects, as the base current, a dummy current supplied to the dummy transistor from the voltage follower circuit.

17. The test apparatus according to claim 16, wherein the base current detecting section further includes, for each transistor in the buffer, a switch section that switches between (a) the base voltage of the transistor and (b) a reference voltage, the reference voltage operable to bring the dummy transistor into an OFF state, supplied to an input terminal of the voltage follower circuit.

18. The test apparatus according to claim 1, wherein the driver circuit includes a pattern operation mode to output a pattern signal having a predetermined logic pattern and a high-impedance operation mode to bring an output of the driver section into a high impedance, and when operating in the high-impedance operation mode, the output control section controls the plurality of voltages so that a difference between the current detected by the high-voltage-side detecting section and the current detected by the low-voltage-side detecting section becomes 0.

19. A driver circuit for outputting a signal corresponding to an input signal, comprising:
   a driver section that outputs the test signal and selects a voltage of the test signal according to the input signal, from among a plurality of voltages supplied to the driver section, the driver section including a buffer that supplies a supply current to the device under test from a high voltage power-source line, and draws a draw current from the device under test into a low voltage power-source line, the buffer including:
      a high voltage transistor having a first collector terminal electrically connected to the high voltage power-source line, and a first emitter terminal electrically connected to the device under test through which the test signal is outputted, and
      a low voltage transistor having a second emitter terminal electrically connected to the first emitter terminal, and a second collector terminal electrically connected to the low voltage power-source line,
   a supply current detecting section that detects the supply current, the supply current detecting section including:
      a high-voltage-side detecting section provided between the high voltage power-source line and the high voltage transistor, and detects a high voltage current of the first collector, and
      a low-voltage-side detecting section provided between the low voltage power-source line and the low voltage transistor, and detects a low voltage current of the second collector,
   a base current detecting section that detects a high voltage base current of the high voltage transistor and a low voltage base current of the low voltage transistor, and
   an output control section that controls one of a voltage and a current of the test signal based on the supply current detected by the supply current detecting section, and controls the plurality of voltages so that a difference between a high emitter current and a low emitter current becomes a predetermined constant current, the high emitter current obtained as a summation of the high voltage current and the high voltage base current, and the low emitter current obtained as a summation of the low voltage current and the low voltage base current.

20. The driver circuit according to claim 19, wherein the output control section includes:
   a static characteristic data storage section that stores static characteristic data representing a relation between the high voltage current and the high voltage base current, and a relation between the low voltage current and the low voltage base current; and
   a control circuit that controls the plurality of voltages;
   wherein the high voltage base current and the low voltage base current are calculated from the static characteristic data.

21. The driver circuit according to claim 19, further comprising a current compensating circuit that matches the high voltage current to the high emitter current and the low voltage current to the low emitter current, by adjusting the high voltage current by a high compensation current and adjusting the low voltage current by a low compensation current, the high compensation current corresponding to the high voltage current and the low compensation current corresponding to the low voltage current, the high compensation current and the low compensation current detected by the supply current detecting section.

22. The driver circuit according to claim 19, further comprising:
   a replica driver section corresponding to the driver section that outputs the voltage selected by the driver section from the plurality of voltages supplied to the driver section,
   a replica transmission end resistance that is provided at an output end of the replica driver section corresponding to a transmission end resistance provided between the driver section and the device under test, and
   a replica load circuit that simulates the load voltage.

23. The driver circuit according to claim 19, wherein the base current detecting section includes, for each transistor in the buffer:
   a dummy transistor having an emitter terminal electrically connected to the emitter terminal of the transistor, and a collector terminal electrically connected to the collector terminal of the transistor;
   a voltage follower circuit that supplies a voltage corresponding to the base voltage of the transistor to a base terminal of the dummy transistor; and
   a dummy current detecting section that detects, as the base current, a dummy current supplied to the dummy transistor from the voltage follower circuit.

24. The driver circuit according to claim 23, wherein the base current detecting section further includes, for each transistor in the buffer, a switch section that switches between (a) the base voltage of the transistor and (b) a reference voltage, the reference voltage operable to bring the dummy transistor into an OFF state, supplied to an input terminal of the voltage follower circuit.

25. A device for outputting a test signal and selecting a voltage of the test signal according to the input signal, the device comprising:
   a buffer that supplies a supply current to the device under test from a high voltage power-source line, and draws a draw current from the device under test into a low voltage power-source line, the buffer including:

a high voltage transistor having a first collector terminal electrically connected to the high voltage power-source line, and a first emitter terminal electrically connected to the device under test through which the test signal is outputted, and a low voltage transistor having a second emitter terminal electrically connected to the first emitter terminal, and a second collector terminal electrically connected to the low voltage power-source line;

wherein a supply current detecting section detects the supply current, the supply current detecting section including:

a high-voltage-side detecting section provided between the high voltage power-source line and the high voltage transistor, and detects a high voltage current of the first collector, and a low-voltage-side detecting section provided between the low voltage power-source line and the low voltage transistor, and detects a low voltage current of the second collector;

wherein a base current detecting section detects a high voltage base current of the high voltage transistor and a low voltage base current of the low voltage transistor; and wherein an output control section controls one of a voltage and a current of the test signal based on the supply current detected by the supply current detecting section, and controls the plurality of voltages so that a difference between a high emitter current and a low emitter current becomes a predetermined constant current, the high emitter current obtained as a summation of the high voltage current and the high voltage base current, and the low emitter current obtained as a summation of the low voltage current and the low voltage base current.

26. The device according to claim 25, further comprising a pre-driver that supplies a voltage corresponding to one of the plurality of voltages supplied thereto that corresponds to a logic value of the input signal, to a base terminal of the high voltage transistor and a base terminal of the low voltage transistor, wherein the output control section controls the voltage supplied to the pre-driver, based on the supply current detected by the supply current detecting section.

27. The device according to claim 25, further comprising a voltage shift section that shifts the voltage supplied from the pre-driver by a first predetermined pre-driver voltage, supplies the shifted voltage to the base terminal of the high voltage transistor, shifts the voltage supplied from the pre-driver by a second predetermined pre-driver voltage, and supplies the shifted voltage to the base terminal of the low voltage transistor.

28. The device according to claim 25, wherein the output control section includes:

a static characteristic data storage section that stores static characteristic data representing a relation between the high voltage current and the high voltage base current, and a relation between the low voltage current and the low voltage base current; and a control circuit that controls the plurality of voltages;

wherein the high voltage base current and the low voltage base current are calculated from the static characteristic data.

29. The device according to claim 25 wherein a current compensating circuit matches the high voltage current to the high emitter current and the low voltage current to the low emitter current, by adjusting the high voltage current by a high compensation current and adjusting the low voltage current by a low compensation current, the high compensation current corresponding to the high voltage current and the low compensation current corresponding to the low voltage current, the high compensation current and the low compensation current detected by the supply current detecting section.

30. The device according to claim 25, wherein:

a replica driver section outputs the selected voltage of the test signal from the plurality of voltages;

a replica transmission end resistance is provided at an output end of the replica driver section corresponding to a transmission end resistance provided between the driver section and the device under test; and a replica load circuit simulates the load voltage.

* * * * *